(12) United States Patent
Gaikwad et al.

(10) Patent No.: US 8,199,857 B2
(45) Date of Patent: Jun. 12, 2012

(54) APPARATUS TO RECONFIGURE AN 802.11A/N TRANSCEIVER TO SUPPORT 802.11J/10 MHZ MODE OF OPERATION

(75) Inventors: Rohit V. Gaikwad, San Diego, CA (US); David Chuong Lam, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 996 days.

(21) Appl. No.: 12/213,175

(22) Filed: Jun. 16, 2008

(65) Prior Publication Data

US 2008/0310558 A1 Dec. 18, 2008

Related U.S. Application Data

(60) Provisional application No. 60/929,149, filed on Jun. 15, 2007, provisional application No. 60/960,384, filed on Sep. 27, 2007, provisional application No. 60/929,154, filed on Jun. 15, 2007, provisional application No. 60/929,155, filed on Jun. 15, 2007, provisional application No. 60/929,156, filed on Jun. 15, 2007, provisional application No. 60/960,706, filed on Oct. 10, 2007.

(51) Int. Cl.
*H03K 9/00* (2006.01)
(52) U.S. Cl. ........................................ 375/316
(58) Field of Classification Search .................. 375/267, 375/316, 345
See application file for complete search history.

(56) References Cited

U.S. PATENT DOCUMENTS

| | | |
|---|---|---|
| 5,454,010 A | 9/1995 | Leveque |
| 5,477,504 A | 12/1995 | Hagerty |
| 5,740,526 A | 4/1998 | Bonta et al. |
| 5,822,373 A | 10/1998 | Addy |
| 6,307,883 B1 | 10/2001 | Kanada et al. |
| 6,587,513 B1 | 7/2003 | Ichihara |
| 6,728,517 B2 | 4/2004 | Sugar et al. |

(Continued)

FOREIGN PATENT DOCUMENTS

CN 1647404 7/2005

(Continued)

OTHER PUBLICATIONS

Intensi-fi Product Brief: Draft-802.11n Product Family, Broadcom Corporation Intensi-fi-PB03-R, Jun. 27, 2008, 2 pages.

(Continued)

*Primary Examiner* — Jaison Joseph
(74) *Attorney, Agent, or Firm* — Sterne, Kessler, Goldstein & Fox, P.L.L.C.

(57) ABSTRACT

A method and apparatus is disclosed to dynamically reconfigure a communications receiver to support one or more single stream modes of operation, multiple stream modes of operation, and/or propriety modes of operation. The communications receiver is configured to support according to a first single stream mode of operation, multiple stream mode of operation, and/or proprietary mode of operation according to a known single stream communications standard, a known multiple stream communications standard and/or a proprietary communications standard. The communications receiver may receive a single stream communications signal and/or a multiple stream communications signal having a second single stream mode of operation, multiple stream mode of operation, and/or proprietary mode of operation according to a known single stream communications standard, a known multiple stream communications standard and/or a proprietary communications standard. The communications receiver may be dynamically re-configured to the second single stream mode of operation, multiple stream mode of operation, and/or proprietary mode of operation to process the single stream communications signal and/or a multiple stream communications signal.

22 Claims, 10 Drawing Sheets

U.S. PATENT DOCUMENTS

| | | |
|---|---|---|
| 6,862,315 B1 | 3/2005 | Garg et al. |
| 7,035,345 B2 | 4/2006 | Jeckeln et al. |
| 7,095,994 B1* | 8/2006 | Aytur et al. ............... 455/234.1 |
| 7,161,987 B2 | 1/2007 | Webster et al. |
| 7,177,374 B2 | 2/2007 | Gaikwad et al. |
| 7,183,847 B2 | 2/2007 | Suzuki et al. |
| 7,233,773 B2 | 6/2007 | Hansen et al. |
| 7,259,630 B2 | 8/2007 | Bachman et al. |
| 7,269,430 B2 | 9/2007 | Moorti et al. |
| 7,279,972 B2 | 10/2007 | Smithson |
| 7,321,264 B2 | 1/2008 | Kokkeler |
| 7,340,265 B2 | 3/2008 | Husted et al. |
| 7,386,063 B1 | 6/2008 | Husted |
| 7,403,573 B2 | 7/2008 | DeBruyn et al. |
| 7,414,470 B2 | 8/2008 | Okazaki |
| 7,450,533 B2 | 11/2008 | Aoki et al. |
| 7,480,234 B1 | 1/2009 | Hart et al. |
| 7,483,802 B2 | 1/2009 | Wood |
| 7,577,413 B2 | 8/2009 | He et al. |
| 7,620,373 B2 | 11/2009 | Cole et al. |
| 7,646,876 B2 | 1/2010 | Chu et al. |
| 7,822,406 B2* | 10/2010 | Lee et al. ..................... 455/411 |
| 7,881,390 B2 | 2/2011 | Sadowsky et al. |
| 7,881,402 B2 | 2/2011 | Gao et al. |
| 7,890,061 B2* | 2/2011 | Kasher et al. ............ 455/67.11 |
| 2003/0203743 A1 | 10/2003 | Sugar et al. |
| 2004/0121753 A1 | 6/2004 | Sugar et al. |
| 2004/0264600 A1* | 12/2004 | Kao et al. ..................... 375/316 |
| 2005/0064892 A1 | 3/2005 | Cavin |
| 2005/0113120 A1 | 5/2005 | Rappaport et al. |
| 2005/0117660 A1 | 6/2005 | Vialle et al. |
| 2005/0243942 A1 | 11/2005 | Sawai |
| 2006/0084402 A1 | 4/2006 | Oshima et al. |
| 2006/0146869 A1* | 7/2006 | Zhang et al. ............... 370/465 |
| 2006/0182074 A1* | 8/2006 | Kubler et al. ............... 370/338 |
| 2006/0182168 A1 | 8/2006 | Wang et al. |
| 2006/0198477 A1 | 9/2006 | Moorti et al. |
| 2006/0223483 A1* | 10/2006 | Behzad ......................... 455/323 |
| 2006/0229029 A1 | 10/2006 | Waltho et al. |
| 2006/0285478 A1 | 12/2006 | Gaikwad et al. |
| 2007/0002878 A1 | 1/2007 | Moorti et al. |
| 2007/0002963 A1 | 1/2007 | Pedersen et al. |
| 2007/0002981 A1* | 1/2007 | Gaikwad et al. ............ 375/346 |
| 2007/0004372 A1 | 1/2007 | Adams et al. |
| 2007/0019749 A1* | 1/2007 | Gaikwad et al. ............ 375/260 |
| 2007/0019750 A1* | 1/2007 | Gaikwad et al. ............ 375/260 |
| 2007/0060162 A1* | 3/2007 | Xhafa et al. ................ 455/450 |
| 2007/0064842 A1 | 3/2007 | Ross et al. |
| 2007/0105587 A1 | 5/2007 | Lu |
| 2007/0110197 A1* | 5/2007 | Bagchi et al. ............... 375/349 |
| 2007/0202749 A1 | 8/2007 | Bhat et al. |
| 2007/0218851 A1* | 9/2007 | Soe et al. ..................... 455/209 |
| 2007/0224935 A1 | 9/2007 | Waxman |
| 2007/0230328 A1 | 10/2007 | Saitou |
| 2008/0013654 A1* | 1/2008 | Rick et al. ................... 375/345 |
| 2008/0095260 A1 | 4/2008 | Vaidyanathan |
| 2008/0101495 A1 | 5/2008 | Gaikwad |
| 2008/0101496 A1 | 5/2008 | Gaikwad |
| 2008/0101497 A1 | 5/2008 | Gaikwad et al. |
| 2008/0118013 A1 | 5/2008 | Vis et al. |
| 2008/0139156 A1 | 6/2008 | Behzad et al. |
| 2008/0159442 A1* | 7/2008 | Tanabe et al. ............... 375/324 |
| 2008/0293368 A1* | 11/2008 | Desai et al. .................. 455/138 |
| 2008/0309405 A1 | 12/2008 | Young |
| 2008/0310336 A1 | 12/2008 | Gaikwad |
| 2008/0310487 A1 | 12/2008 | Hammerschmidt |
| 2008/0310557 A1 | 12/2008 | Gaikwad |
| 2008/0310559 A1 | 12/2008 | Gaikwad |
| 2009/0325507 A1 | 12/2009 | Trachewsky et al. |
| 2010/0137024 A1* | 6/2010 | Maguire ..................... 455/552.1 |
| 2010/0208852 A1 | 8/2010 | Feher |

FOREIGN PATENT DOCUMENTS

| | | |
|---|---|---|
| WO | WO/03/090370 | 10/2003 |

OTHER PUBLICATIONS

English Language Abstract and Bibliographic Information for Chinese Patent Application Publication No. CN 1647404 (listed on accompanying PTO/SB/08A document as FP1), Published on Jul. 27, 2005, 1 page.

"Wireless LAN Medium Access Control (MAC) and Physical Layer (PHY) Specifications: High-Speed Physical Layer in the 5 GHZ Band", IEEE Standard 802.11 a-1999, Part 11, IEEE, 90 pages.

* cited by examiner

APPARATUS TO RECONFIGURE AN 802.11A/N TRANSCEIVER TO SUPPORT 802.11J/10 MHZ MODE OF OPERATION

CROSS-REFERENCE TO RELATED APPLICATIONS

The present application is related to U.S. Provisional Patent Appl. No. 60/929,149, filed Jun. 15, 2007, U.S. Provisional Patent Appl. No. 60/960,384, filed Sep. 27, 2007, U.S. Provisional Patent Appl. No. 60/929,154, filed Jun. 15, 2007, U.S. Provisional Patent Appl. No. 60/929,155, filed Jun. 15, 2007, U.S. Provisional Patent Appl. No. 60/929,156, filed Jun. 15, 2007, U.S. Provisional Patent Appl. No. 60/960,706, filed Oct. 10, 2007, U.S. patent application Ser. No. 12/004,406, filed Dec. 21, 2007, U.S. patent application Ser. No. 12/213,172, filed Jun. 16, 2008, U.S. patent application Ser. No. 12/213,176, filed Jun. 16, 2008, and U.S. patent application Ser. No. 12/213,179, filed Jun. 16, 2008, each of which is incorporated by reference herein in its entirety.

BACKGROUND OF THE INVENTION

1. Field of the Invention

The present invention relates generally to a communications receiver, more specifically to re-configuring the communication receiver to support one or more single stream modes of operation, multiple stream modes of operation, and/or propriety modes of operation.

2. Related Art

A communication system typically involves transmitting an information signal as a communications signal from a communications transmitter to a communications receiver over a communication channel. The information signal may include one or more signal channel bandwidths that define one or more modes of operation. The communications transmitter may include a single transmit antenna to produce a single stream communications signal or multiple transmit antenna to produce a multiple stream communications signal.

The communication receiver may include multiple receive antenna to receive the communications signal as it traverses through the communication channel. Commonly, the communication receiver may process the received communication signal according to a single mode of operation. For example, the communication receiver may process the received communication signal according to a 20 MHz mode of operation. However, to process one or more other modes of operation, such as a 10 MHz mode of operation, requires redesign of the communications receiver.

Therefore, what is needed is communication receiver that is configured to support a single mode of operation that may be reconfigured to support one or more other modes of operation.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 1A:
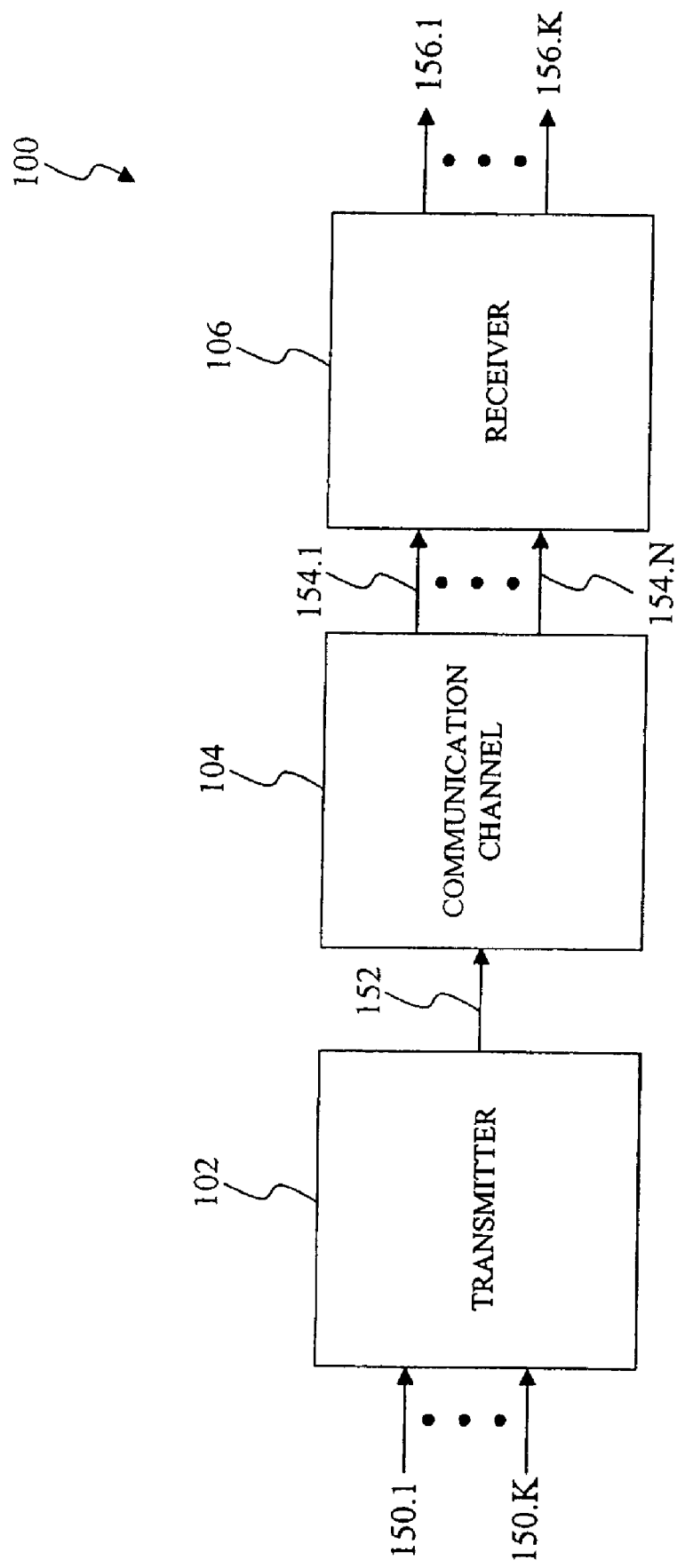
FIG. 1A illustrates a block diagram of a communications environment according to an exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner. Likewise, particular bit values of "0" or "1" (and representative voltage values) are used in illustrative examples provided herein to represent information for purposes of illustration only. Information described herein may be represented by either bit value (and by alternative voltage values), and embodiments described herein may be configured to operate on either bit value (and any representative voltage value), as would be understood by persons skilled in the relevant art(s).

The example embodiments described herein are provided for illustrative purposes, and are not limiting. Further structural and operational embodiments, including modifications/alterations, will become apparent to persons skilled in the relevant art(s) from the teachings herein.

Exemplary Communications Environment

FIG. 1A illustrates a block diagram of a communications environment according to an exemplary embodiment of the present invention. A communications environment 100 is an exemplary representation of a single-input and multiple-output (SIMO) communications environment that includes the use of a single transmit antenna at a communications transmitter 102 and multiple receive antennas at a communications receiver 106. The communications environment 100 includes the communications transmitter 102 to transmit at least one information signal as received from at least one transmitter user device, denoted as information signals 150.1 through 150.K, to the communications receiver 106 via a communication channel 104. The transmitter user devices may include, but are not limited to, personal computers, data terminal equipment, telephony devices, broadband media players, personal digital assistants, software applications, or any other medium capable of transmitting or receiving data. However, those skilled in the relevant art(s) will recognize that the information signals 150.1 through 150.K may include a single information signal, such as the information signal 150.1 to provide an example, without departing from the spirit and scope of the present invention.

The communications transmitter 102 produces a transmitted communications signal 152 by encoding the information signals 150.1 through 150.K according to a known single stream communications standard, such as, but not limited to, the Institute of Electrical and Electronics Engineers (IEEE) 802.11a™ standard, the IEEE 802.11b™ standard, the IEEE 802.11g™ standard, the IEEE 802.11j™ standard, a propriety communications protocol, to be discussed below, and/or any other suitable single stream communications standard. The IEEE 802.11a™ standard, the IEEE 802.11b™ standard, and the IEEE 802.11g™ standard are incorporated herein by reference in their entirety. As shown in FIG. 1A, the transmitted communications signal 152 represents a single stream communication signal. In other words, the communications transmitter 102 may encode the information signals 150.1 through 150.K to produce the transmitted communications signal 152.

The transmitted communications signal 152 passes through the communication channel 104 to produce received communication signals 154.1 through 154.N. The communication channel 104 may include, but is not limited to, a microwave radio link, a satellite channel, a fiber optic cable, a hybrid fiber optic cable system, or a copper cable to provide some examples. The communication channel 104 contains a propagation medium that the transmitted communications signal 152 passes through before reception by the communications receiver 106. The propagation medium of the communication channel 104 introduces interference and/or distortion into the transmitted communications signal 152 to produce the received communication signals 154.1 through 154.N. For example, noise such as, but not limited to, thermal noise, burst noise, impulse noise, interference, signal strength variations known as fading, phase shift variations, to provide some examples, may introduce interference and/or distortion into the transmitted communications signal 152. In addition, the propagation medium of the communication channel 104 may cause the transmitted communications signal 152 to reach the communications receiver 106 by multiple communication paths, reflecting from different objects, surface areas, surface boundaries, and interfaces in the communications environment 100. Potential causes of multipath propagation may include, but are not limited to, atmospheric ducting, ionospheric reflection and/or refraction, and/or reflection from terrestrial objects such as mountains and/or buildings to provide some examples.

The communications receiver 106 may include at least one receiving antenna to capture the received communication signals 154.1 through 154.N. In an exemplary embodiment, the communications receiver 106 includes two receiving antenna to capture the received communication signals 154.1 through 154.2. The received communication signals 154.1 through 154.N represent the multiple communication paths traversed by the transmitted communications signal 152 resulting from the multipath propagation introduced by the communication channel 104. For example, the received communications signal 154.1 represents the transmitted communications signal 152 as it traverses through a first communication path of the communication channel 104. Likewise, the received communications signal 154.N represents the transmitted communications signal 152 as it traverses through an $N^{th}$ communication path of the communication channel 104. The communications receiver 106 may recover the at least one information signal from the at least one transmitter user device to produce at least one recovered information signal, denoted as recovered information signals 156.1 through 156.K, for at least one receiver user device by operating upon the received communication signals 154.1 through 154.N according to the known single stream communications standard and/or the propriety communications protocol. The receiver user devices may include, but are not limited to, personal computers, data terminal equipment, telephony devices, broadband media players, personal digital assistants, software applications, or any other medium capable of transmitting or receiving data. However, those skilled in the relevant art(s) will recognize that the recovered information signals 156.1 through 156.K may include a single recovered information signal, such as the recovered information signal 156.1 to provide an example, without departing from the spirit and scope of the present invention.

Figure 1B:
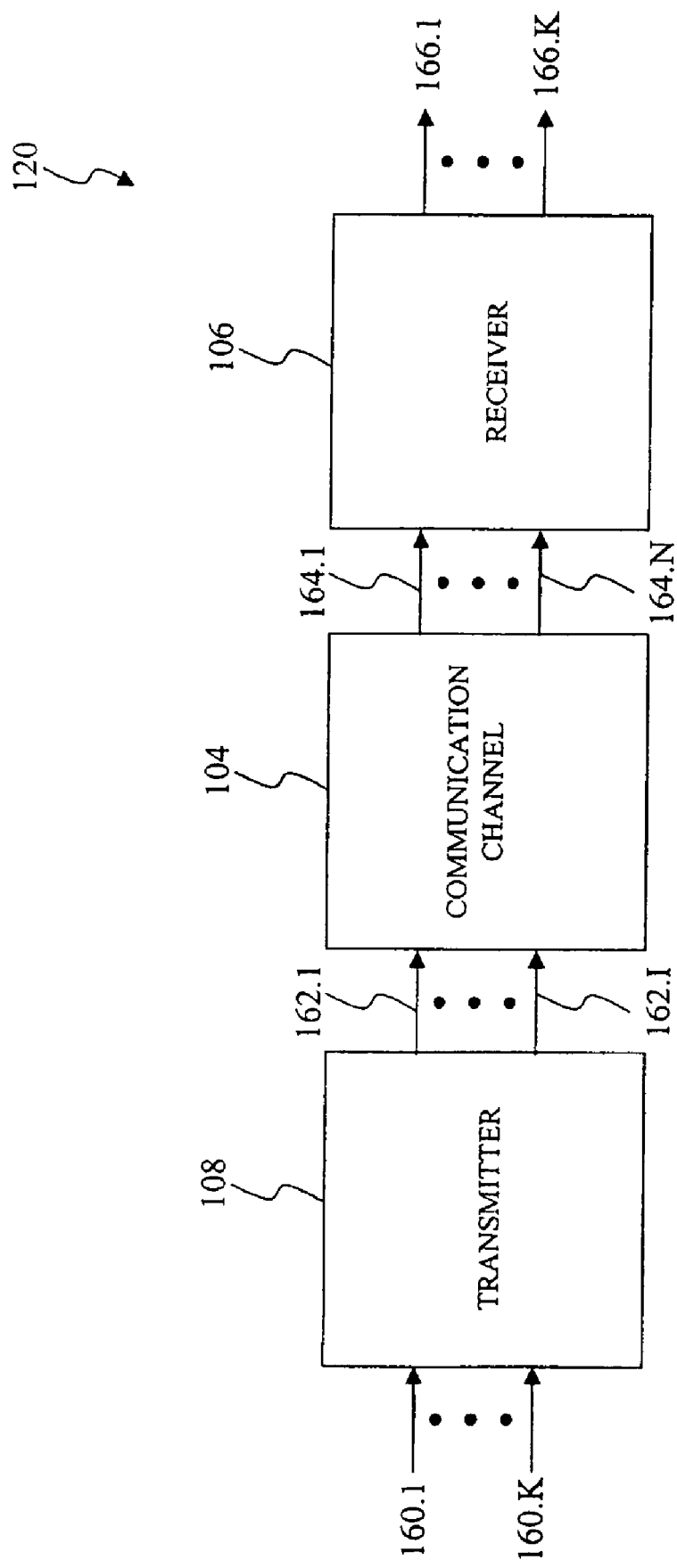
FIG. 1B illustrates a block diagram of another communications environment according to another exemplary embodiment of the present invention.

FIG. 1B illustrates a block diagram of another communications environment according to another exemplary embodiment of the present invention. A communications environment 120 is an exemplary representation of a multiple-input and multiple-output (MIMO) communications environment that includes the use of multiple transmit antennas at a communications transmitter 108 and multiple receive antennas at the communications receiver 106. The communications environment 120 includes the communications transmitter 108 to transmit at least one information signal as received from at least one transmitter user device, denoted as information signals 160.1 through 160.K, to the communications receiver 106 via a communication channel 104. The transmitter user devices may include, but are not limited to, personal computers, data terminal equipment, telephony devices, broadband media players, personal digital assistants, software applications, or any other medium capable of transmitting or receiving data. However, those skilled in the relevant art(s) will recognize that the information signals 160.1 through 160.K may include a single information signal, such as the information signal 160.1, without departing from the spirit and scope of the present invention.

The communications transmitter 108 produces transmitted communication signals 162.1 through 162.I by encoding the information signals 160.1 through 160.K according to a known multiple stream communications standard such as, but not limited to, the IEEE 802.11n™ standard, a propriety communications protocol, to be discussed below, and/or any other suitable multiple stream communications standard. The IEEE 802.11n™ standard is incorporated herein by reference in its entirety. As shown in FIG. 1B, the transmitted communication signals 162.1 through 162.I together represent a multiple stream communication signal. The communications transmitter 108 may encode at least one of the information signals 160.1 through 160.K to produce the transmitted communication signals 162.1 through 162.I. For example, the communications transmitter 108 may encode the information signal 160.1 to produce the transmitted communications signal 162.1. Alternatively, the communications transmitter 108 may encode more than one of information signals 160.1 through 160.K to produce at least one transmitted communication signal 162.1 through 162.I. For example, the communications transmitter 108 may encode the information signal 160.1 and the information signal 160.2 to produce the transmitted communications signal 162.1.

The transmitted communication signals 162.1 through 162.I pass through the communication channel 104 to produce received communication signals 164.1 through 164.N. The transmitted communication signals 162.1 through 162.I may include a similar or a dissimilar number of communication signals as the received communication signals 164.1 through 164.N. The propagation medium of the communication channel 104 introduces interference and/or distortion into the transmitted communication signals 162.1 through 162.I to produce the received communication signals 164.1 through 164.N. For example, noise such as, but not limited to, thermal noise, burst noise, impulse noise, interference, signal strength variations known as fading, phase shift variations, to provide some examples, may introduce interference and/or distortion into the transmitted communication signals 162.1 through 162.I. In addition, the propagation medium of the communication channel 104 may cause each of transmitted communication signals 162.1 through 162.I to reach the communications receiver 106 by multiple communication paths, reflecting from different objects, surface areas, surface boundaries, and interfaces in the communications environment 120. Potential causes of multipath propagation may include, without limitation, atmospheric ducting, ionospheric reflection and/or refraction, and/or reflection from terrestrial objects such as mountains and/or buildings to provide some examples.

Referring back to FIG. 1B, the communications receiver 106 includes multiple receiving antenna to capture the received communication signals 164.1 through 164.N. In an exemplary embodiment, the communications receiver 106 includes two receiving antennas to capture the received communication signals 164.1 through 164.2. The received communication signals 164.1 through 164.N represent the multiple communication paths traversed by each of the transmitted communication signals 162.1 through 162.I resulting from the multipath propagation introduced by the communication channel 104. For example, the received communications signal 164.1 represents the transmitted communication signals 162.1 through 162.I as they traverse through a first communication path of the communication channel 104. Likewise, the received communications signal 164.N represents the transmitted communication signals 162.1 through 162.I as they traverse through an $N^{th}$ communication path of the communication channel 104.

The communications receiver 106 may recover the at least one information signal from the at least one transmitter user device to produce at least one recovered information signal, denoted as recovered information signals 166.1 through 166.K, for at least one receiver user device by operating upon the received communication signals 164.1 through 164.N according to the known multiple stream communications standard and/or the propriety communications protocol. The receiver user devices may include, but are not limited to, personal computers, data terminal equipment, telephony devices, broadband media players, personal digital assistants, software applications, or any other medium capable of transmitting or receiving data. However, those skilled in the relevant art(s) will recognize that the recovered information signals 166.1 through 166.K may include a single recovered information signal, such as the recovered information signal 166.1 to provide an example, without departing from the spirit and scope of the present invention.

As shown in FIG. 1A and FIG. 1B, the communications receiver 106 may, according to the invention, operate in the SIMO communications environment represented by the communications environment 100 and/or the MIMO communications environment represented by the communications environment 120. However, this example is not limiting, the communications receiver 106 may operate in any suitable communications environment that will be apparent to one skilled in the relevant art(s) without departing from the spirit and scope of the present invention.

Exemplary Communications Receiver

Figure 2:
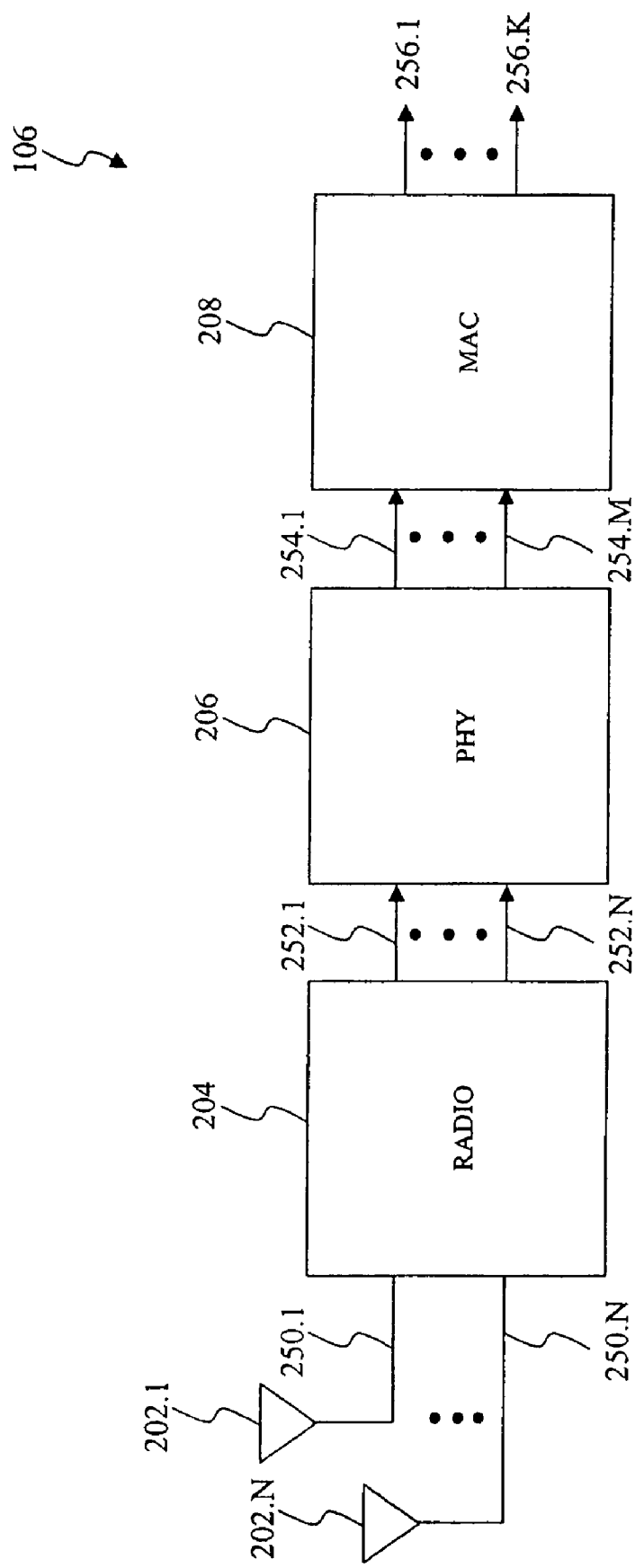
FIG. 2 illustrates a block diagram of a communications receiver according to an exemplary embodiment of the present invention.

FIG. 2 illustrates a block diagram of a communications receiver according to an exemplary embodiment of the present invention. More specifically, FIG. 2 illustrates a block diagram of an exemplary embodiment of the communications receiver 106 as shown in FIG. 1A and FIG. 1B. As will be understood by persons skilled in the relevant art(s) from the teachings provided herein, the communications receiver 106 may be readily implemented in hardware, software, or a combination of hardware and software. For example, based on the teachings provided herein, a person skilled in the relevant art(s) could implement the communications receiver 106 via a combination of at least one application specific integrated circuit and a processor core for implementing software commands stored in at least one attached memory. However, this example is not limiting, and other implementations are within the scope and spirit of the present invention.

As shown in FIG. 2, the communications receiver 106 includes receiving antennas 202.1 through 202.N, a radio receiver 204, a physical layer interface (PHY) 206, and a media access controller (MAC) 208. The receiving antennas 202.1 through 202.N capture the received communications signals 154.1 through 154.N, the received communications signals 164.1 through 164.N, and/or any suitable combination thereof as shown in FIG. 1A through FIG. 1B. The receiving antennas 202.1 through 202.N convert either the received communications signals 154.1 through 154.N, the received communications signals 164.1 through 164.N, and/or the suitable combination thereof from electromagnetic waves to modulated radio frequency (RF) currents, denoted as received communications signals 250.1 through 250.N in FIG. 2. For example, the receiving antenna 202.1 may produce the received communications signal 250.1 by converting the received communications signal 154.1 from an electromagnetic wave to a modulated RF current. In an exemplary embodiment, the communications receiver 106 includes the receiving antennas 202.1 through 202.N. However, this example is not limiting, the receiving antenna 202 may include any suitable number of antenna without departing the scope and spirit of the present invention.

The radio receiver 204 operates on the received communications signals 250.1 through 250.N to produce downconverted communications signals 252.1 through 252.N. For example, the radio receiver 204 may downconvert the received communications signals 250.1 through 250.N to baseband or any suitable intermediate frequency (IF) to produce the downconverted communications signals 252.1 through 252.N. The radio receiver 204 may additionally perform functions such as, but not limited to, filtering, and/or automatic gain control (AGC).

The PHY 206 provides an interface between the radio receiver 204 and the MAC 208. However, those skilled in the relevant art(s) will recognize that the PHY 206 may directly receive a baseband or near baseband communications signal, such as Asymmetric Digital Subscriber Line (ADSL) to provide an example, from the communication channel 104 without departing from the spirit and scope of the present invention. In other words, herein the radio receiver 204 is optional, the PHY 206 may receive a communications signal, such as the received communications signals 154.1 through 154.N and/or the received communications signals 164.1 through 164.N, directly from the communication channel 104. The PHY 206 processes the downconverted communications signals 252.1 through 252.N to produce decoded communications signals 254.1 through 254.M. More specifically, the PHY 206 decodes the downconverted communications signals 252.1 through 252.N to produce the decoded communications signal 254 according to the known single stream communications standard and/or the known multiple stream communications standard. In an exemplary embodiment, the PHY 206 produces the decoded communications signal 254.1 and the decoded communications signal 254.2, wherein the decoded communications signal 254.1 corresponds to the received communications signals 164.1 through 164.N in the communications environment 120 as shown in FIG. 1B and the decoded communications signal 254.2 corresponds to the received communications signals 154.1 through 154.N in the communications environment 100 as shown in FIG. 1A. However, this example is not limiting, the decoded communications signals 254.1 through 254.M may include any suitable number of decoded communications signals without departing the scope and spirit of the present invention.

The MAC 208 may produce at least one recovered information signal, denoted as recovered information signals 256.1 through 256.K, for at least one receiver user device by operating upon the decoded communications signals 254.1 through 254.M according to the known single stream communications standard and/or the known multiple stream communications standard. The recovered information signals 256.1 through 256.K may represent the recovered information signals 156.1 through 156.K as discussed in the communications environment 100 of FIG. 1A, the recovered information signals 166.1 through 166.K as discussed in the communications environment 120 of FIG. 1B, and/or any suitable combination thereof. The MAC 208 may process at least one decoded communications signal 254.1 through 254.M according to the known single stream communications standard and/or the known multiple stream communications standard to produce at least one recovered information signal 256.1 through 256.K. For example, the MAC 208 may process decoded communications signals 254.1 through 254.4 according to the known single stream communications standard and/or the known multiple stream communications standard to produce the recovered information signal 256.1. Alternatively, the MAC 208 may process the decoded communications signal 254.1 according to the known single stream communications standard and/or the known multiple stream communications standard to produce the recovered information signals 256.1 and 256.2. The MAC 208 may additionally, without limitation, provide addressing and channel access control mechanisms that make it possible for multiple terminals or network nodes to communicate within a multipoint network, typically a local area network (LAN), metropolitan area network (MAN), or a wide area network (WAN).

Exemplary Physical Layer Interface

Figure 3:
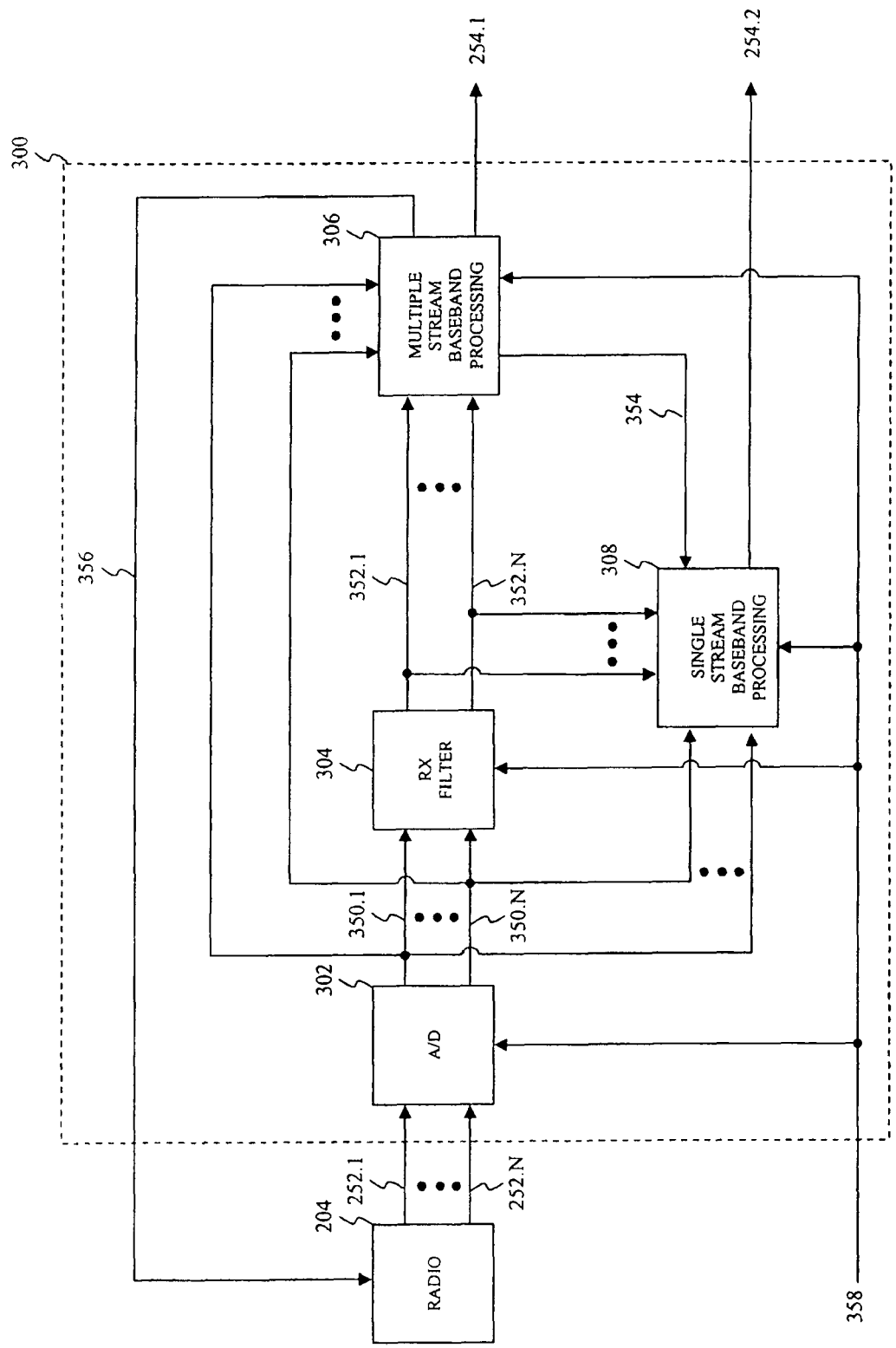
FIG. 3 illustrates a block diagram of a physical layer interface (PHY) according to an exemplary embodiment of the present invention.

FIG. 3 illustrates a block diagram of a physical layer interface (PHY) according to an exemplary embodiment of the present invention. A PHY 300 provides an interface between a media access controller, such as the MAC 208, and a communication channel, such as the communication channel 104, in accordance with the known single stream communications standard, the known multiple stream communications standard, and/or the propriety communications protocol. The PHY 300 may represent an exemplary embodiment of the PHY 206 as shown in FIG. 2.

The ADC 302 converts the downconverted communication signals 252.1 through 252.N from an analog representation to a digital representation to produce digital communication signals 350.1 through 350.N based on a clock 358 operating at a frequency of $f_{nom}$. In an exemplary embodiment, the clock 358 has an operating frequency of 40 MHz corresponding to a 20 MHz mode of operation in accordance with the known single stream communications standard, referred to as a single stream mode of operation, the known multiple stream communications standard, referred to as a multiple stream mode of operation, and/or the propriety communications protocol, referred to as a propriety mode of operation. The single stream mode of operation, the multiple stream mode of operation, and/or the propriety mode of operation may define a signal channel bandwidth according to the known single stream communications standard, the known multiple stream communications standard, and/or the propriety communications protocol. For example, the 20 MHz single stream mode of operation, multiple stream mode of operation, and/or the propriety mode of operation may provide for a signal channel bandwidth of 20 MHz. Alternatively, the clock 358 may operate at a frequency of 80 MHz corresponding to a 40 MHz single stream mode of operation, multiple stream mode of operation, and/or the propriety mode of operation. The ADC 302 samples the downconverted communication signals 252.1 through 252.N at a rate of $f_{nom}$ samples per second to produce the digital communication signals 350.1 through 350.N.

The PHY receiver filter 304 produces encoded multiple stream communication signals 352.1 through 352.N based on the digital communication signals 350.1 through 350.N using the clock 358. In an exemplary embodiment, the PHY receiver filter 304 may include a PHY receiver filter bandwidth corresponding to the single stream mode of operation, the multiple stream mode of operation, and/or the propriety mode of operation. For example, the PHY receiver filter 304 may include a PHY receiver filter bandwidth of 20 MHz corresponding to the 20 MHz single stream mode of operation, multiple stream mode of operation, and/or propriety mode of operation, and/or the propriety communications protocol or a PHY receiver filter bandwidth of 40 MHz corresponding to the 40 MHz single stream mode of operation, multiple stream mode of operation, and/or propriety mode of operation. The PHY receiver filter 304 filters out of band noise and/or interference from the digital communication signals 350.1 through 350.N at a rate of $f_{nom}$ samples per second to produce the encoded multiple stream communication signals 352.1 through 352.N. The out of band noise and/or interference may result from, without limitation, noise and/or interference resulting from the communication channel 104, noise and/or interference resulting from the radio receiver 204 and/or the ADC 302, and/or noise and/or interference resulting from adjacent channels in the received communication signals 154.1 through 154.N and/or the received communication signals 164.1 through 164.N to provide some examples. Further discussion of the PHY receiver filter 304 is disclosed in U.S. patent application Ser. No. 12/213,176, filed on Jun. 16, 2008, which is incorporated by reference in its entirety.

The multiple stream baseband processing module 306 produces the decoded communications signal 254.1 based on the digital communication signals 350.1 through 350.N and/or the encoded multiple stream communication signals 352.1 through 352.N using the clock 358. More specifically, the multiple stream baseband processing module 306 processes the digital communication signals 350.1 through 350.N and/or the encoded multiple stream communication signals 352.1 through 352.N at a rate of $f_{nom}$ samples per second to produce the decoded communications signal 254.1. The functionality of the multiple stream baseband processing module 306 may include, without limitation, calculating the magnitude of at least one digital communication signal 350.1 through 350.N, detecting the presence of the multiple stream communications signal from the encoded multiple stream communication signals 352.1 through 352.N, and/or decoding of the encoded multiple stream communication signals 352.1 through 352.N according to the known multiple stream communications standard and/or the proprietary communications protocol.

The multiple stream baseband processing module 306 may calculate or gather at least one signal metric, such as but not limited to, the mean, the total energy, the average power, the mean square, the instantaneous power, the root mean square, the variance, the norm, and/or any other suitable signal metric to provide some examples, of at least one digital communication signal 350.1 through 350.N. The multiple stream baseband processing module 306 may generate a single stream selection signal 354 based upon the at least one signal, metric to be used by the single stream baseband processing module 308. N to select one of the digital communication signals 350.1 through 350.N and/or one of the encoded multiple stream communication signals 352.1 through 352.N. The multiple stream baseband processing module 306 may generate a radio adjustment signal 356 to adjust a gain of the radio receiver 204 based on the at least one signal metric. Further discussion of multiple stream baseband processing module 306 is disclosed in U.S. patent application Ser. No. 12/213,172, filed on Jun. 16, 2008, which is incorporated by reference in its entirety.

The single stream baseband processing module 308 produces the decoded communications signal 254.2 based on the digital communication signals 350.1 through 350.N, the encoded multiple stream communication signals 352.1 through 352.N, and/or the single stream selection signal 354 using the clock 358. More specifically, the single stream baseband processing module 308 processes the digital communication signals 350.1 through 350.N, the encoded multiple stream communication signals 352.1 through 352.N, and/or the single stream selection signal 354 at a rate of $f_{nom}$ samples per second to produce the decoded communications signal 254.2.

The single stream baseband processing module 308 may select one of the digital communication signals 350.1 through 350.N or one of the encoded multiple stream communication signals 352.1 through 352.N based upon the single stream selection signal 354 to produce an encoded single stream communication signal. The single stream baseband processing module 308 may include, without limitation, the detection of the presence of the single stream communications signal from the encoded single stream communications signal and/or decode the single stream communications signal according to the known single stream communications standard and/or the proprietary communications protocol to provide some examples. Further discussion of the single stream baseband processing module 308 is disclosed in U.S. patent application Ser. No. 12/213,172, filed on Jun. 16, 2008, which is incorporated by reference in its entirety.

The known single stream communications standard, the known multiple stream communications standard, and/or the proprietary communications standard provides for one or more modes of operation. The PHY 300 may be configured to support the single stream mode of operation, the multiple stream mode of operation, and/or the proprietary mode of operation. For example, the PHY 300 may support the 20 MHz single stream mode of operation, multiple stream mode of operation, and/or proprietary mode of operation and/or the 40 MHz single stream mode of operation, multiple stream mode of operation, and/or proprietary mode of operation. Alternatively, the PHY 300 may be configured to support the single stream mode of operation and/or the proprietary mode of operation and may be dynamically re-configured to support one or more other single stream modes of operation mode of operation, multiple stream modes of operation mode of operation, and/or propriety modes of operation. More specifically, the PHY 300 may be configured to support the single stream mode of operation, the multiple stream mode of operation, and/or the proprietary mode of operation and may be dynamically re-configured to support the one or more other modes of operation having a signal channel bandwidth greater than and/or less than a signal channel bandwidth of the single stream mode of operation, the multiple stream mode of operation, and/or the proprietary mode of operation. For example, the PHY 300 may be configured to support the 20 MHz single stream mode of operation, multiple stream mode of operation, and/or proprietary mode of operation and may be dynamically re-configured to support a 40 MHz single stream mode of operation, multiple stream mode of operation, and/or proprietary mode of operation and/or a 10 MHz single stream mode of operation, multiple stream mode of operation, and/or proprietary mode of operation. In another alternative, the PHY 300 may be initially configured to support the one or more other single stream modes of operation, multiple stream modes of operation, and/or propriety modes of operation.

Exemplary Radio Receivers

The PHY 300 may dynamically reconfigure at least one of: the radio receiver 204, the PHY receiver filter 304, the multiple stream baseband processing module 306, and/or the clock 358 to provide some examples, to support the one or more other single stream modes of operation, multiple stream modes of operation, and/or propriety modes of operation.

Figure 4:
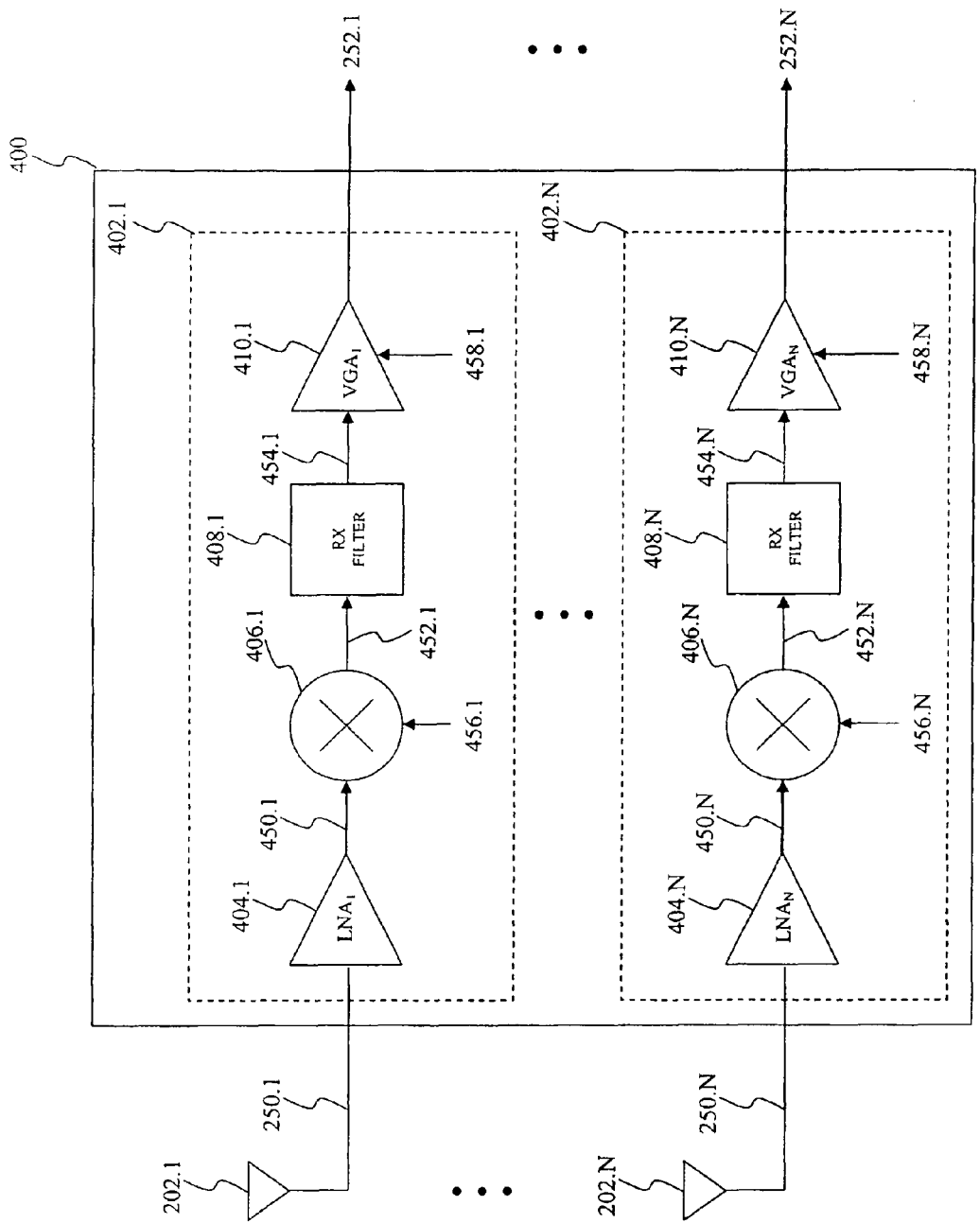
FIG. 4 illustrates a block diagram of a radio receiver according to an exemplary embodiment of the present invention

FIG. 4 illustrates a block diagram of a radio receiver according to an exemplary embodiment of the present invention. A radio receiver 400 operates on the received communications signals 250.1 through 250.N as captured from a communication channel, such as the communication channel 104 to provide an example, by receiving antennas 202.1 through 202.N to produce downconverted communications signals 252.1 through 252.N. For example, the radio receiver 400 may downconvert the received communications signals 250.1 through 250.N to baseband or any suitable intermediate frequency (IF) to produce the downconverted communications signals 252.1 through 252.N. The radio receiver 400 may represent an exemplary embodiment of the radio receiver 204 as shown in FIG. 2.

The radio receiver 400 includes radio receiver chains 402.1 through 402.N, each radio receiver chain is configured to receive a corresponding received communications signal 250.1 through 250.N and to produce corresponding downconverted communications signal 252.1 through 252.N. The downconverted communications signal 252.1 through 252.N may include at least one single stream signal field according to the known single stream communications standard and/or at least one multiple stream signal field according to the known multiple stream communications standard. The single stream signal field may include a single stream preamble and/or a single stream information payload. Likewise, the multiple stream signal field may include a multiple stream preamble and/or a multiple stream information payload. Further discussion of the at least one single stream signal field and/or the at least one multiple stream signal field is disclosed in U.S. patent application Ser. No. 12/213,176, filed on Jun. 16, 2008, which is incorporated by reference in its entirety.

In an exemplary embodiment, each receiving antenna 202.1 through 202.N is coupled to a corresponding radio receiver chain 402.1 through 402.N. However, this example is not limiting, those skilled in the relevant art(s) will recognize that receiving antenna 202.1 through 202.N may be coupled to at least one corresponding radio receiver chain 402.1 through 402.N without departing from the spirit and scope of the present invention. The radio receiver chains 402.1 through 402.N operate in a substantially similar manner, thus only radio receiver chain 402.1 will be described in further detail.

The radio receiver chain 402.1 includes a low noise amplifier (LNA) 402.1, a mixer 406.1, a radio receiver filter 408.1, and a variable gain amplifier (VGA) 410.1. The LNA 404.1 receives the received communications signal 250.1 as captured from a communication channel, such as the communication channel 104 to provide an example, by the receiving antenna 202.1. The LNA 404.1 amplifies or attenuates the received communications signal 250.1 by a LNA gain, denoted as $LNA_1$ in FIG. 4, to produce an attenuated communications signal 450.1.

The mixer 406.1 downconverts the attenuated communications signal 450.1 to baseband or any suitable intermediate frequency (IF) to produce the downconverted communications signal 452.1 based on a local oscillator (LO) reference frequency 456.1. The local oscillator (LO) reference frequencies 456.1 through 456.N may be similar and/or dissimilar in frequency to each other. For example, all of the LO reference frequencies 456.1 through 456.N may be similar in frequency or at least one group of the LO reference frequencies 456.1 through 456.N may be similar in frequency. Those skilled in the relevant art(s) will recognize that the functionality of the LNA 404.1 and the mixer 406.1, as described above, may be implemented using a low-noise block (LNB) without departing from the spirit and scope of the present invention.

The radio receiver filter 408.1 produces a filtered communications signal 454.1 based on the downconverted communications signal 452.1. More specifically, the radio receiver filter 408.1 filters out of band noise and/or interference from the downconverted communications signal 452.1. The radio receiver filter 408.1 may select among one or more radio receiver filter bandwidths to filter the at least one single steam signal field and/or the at least one multiple steam signal field. For example, the radio receiver filter 408.1 may select at least one of a training sequence bandwidth to filter the single stream preamble and/or the multiple stream preamble, a single stream information payload bandwidth to filter the single stream information payload, and/or a multiple stream information payload bandwidth to filter the multiple stream information payload. Further discussion of the radio receiver filter 408.1 is disclosed in U.S. patent application Ser. No. 12/213,176, filed on Jun. 16, 2008, which is incorporated by reference in its entirety.

The PHY 300 may dynamically reconfigure the radio receiver filter 408.1 to support the one or more other single stream modes of operation, multiple stream modes of operation, and/or propriety modes of operation. The PHY 300 may dynamically select a radio receiver filter bandwidth based on the single stream mode of operation, the multiple stream mode of operation, and/or the propriety mode of operation among one or more radio receiver filter bandwidths to reconfigure the radio receiver filter 408.1. More specifically, the radio receiver filter 408.1 is configured to filter the downconverted communications signal 452.1 based on a first radio receiver filter bandwidth among the one or more radio receiver filter bandwidths corresponding to a first single stream mode of operation, multiple stream mode of operation, and/or propriety mode of operation. The PHY 300 may dynamically adjust the radio receiver filter bandwidth from the first radio receiver filter bandwidth to a second radio receiver filter bandwidth among the one or more radio receiver filter bandwidths corresponding to a second single stream mode of operation, multiple stream mode of operation, and/or propriety mode of operation. For example, the PHY 300 may reconfigure the radio receiver filter 408.1 to adjust the radio receiver filter bandwidth from the first radio receiver filter bandwidth corresponding to the 20 MHz single stream mode of operation, multiple stream mode of operation, and/or propriety mode of operation to the second radio receiver filter bandwidth corresponding to the 10 MHz single stream mode of operation, multiple stream mode of operation, and/or propriety mode of operation. The radio receiver filter 408.1 may filter the downconverted communications signal 452.1 based on the second radio receive filter bandwidth corresponding to the second mode of operation.

The VGA 410.1 amplifies or attenuates the filtered communications signal 454.1 by a VGA gain, denoted as $VGA_1$ in FIG. 4, to produce the downconverted communications signal 252.1. The VGA gain may be dynamically configured in response to a radio receiver gain control signal 458.1. The radio receiver gain control signals 458.1 through 458.N may be similar and/or dissimilar to each other. For example, all of the radio receiver gain control signals 458.1 through 458.N may be similar causing all of the VGAs 410.1 through 410.N to have a substantially similar gain or at least one radio receiver gain control signal 458.1 through 458.N may be similar causing at least one of the VGAs 410.1 through 410.N to have a substantially similar gain. The radio receiver gain control signals 458.1 through 458.N may represent an exemplary embodiment of the radio adjustment signal 356 as described in FIG. 3. The radio adjustment signal 356 may include a single radio adjustment signal 356 coupled to all of the radio receiver gain control signals 458.1 through 458.N or at least one radio adjustment signal 356 coupled to at least one radio receiver gain control signal 458.1 through 458.N.

Figure 5:
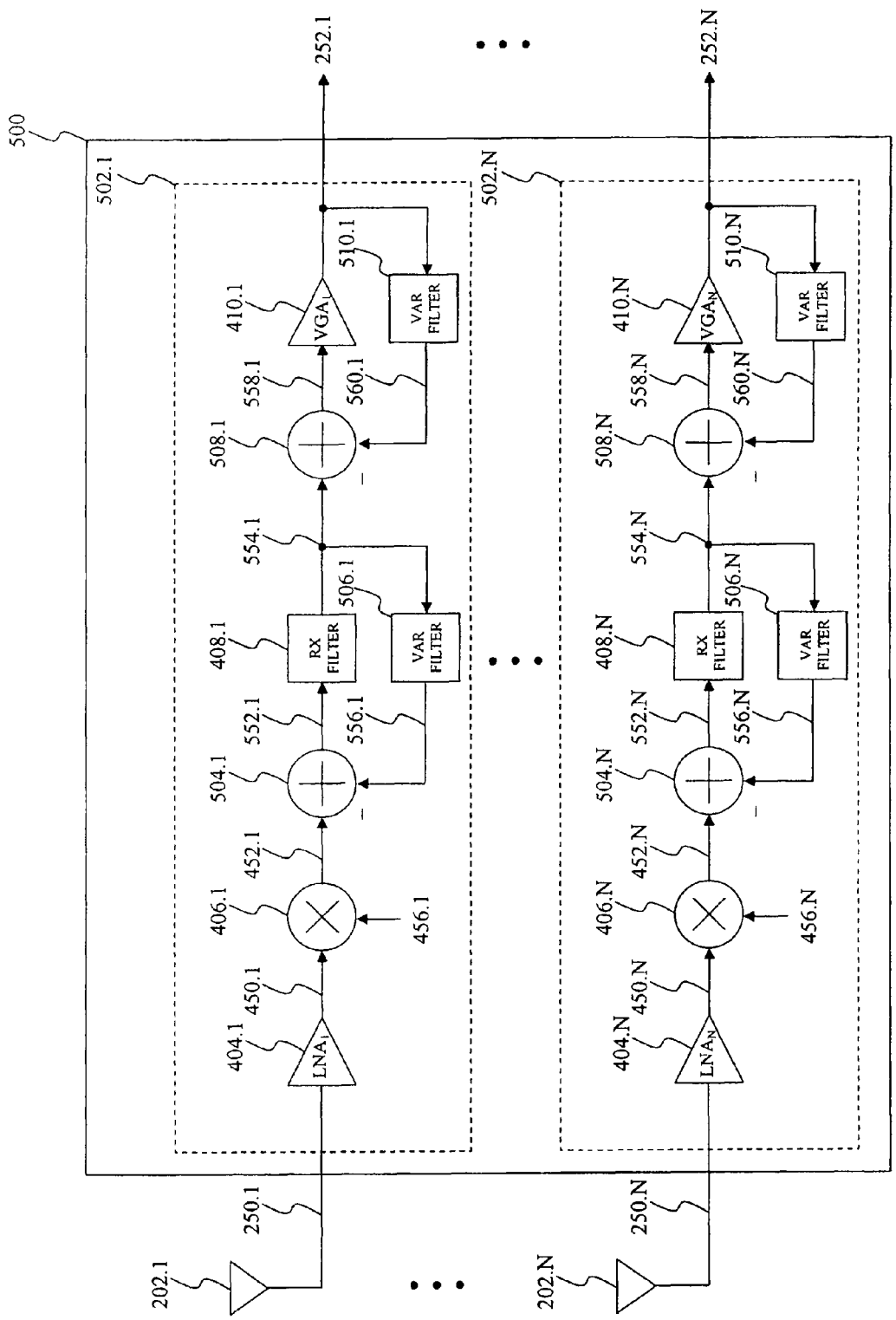
FIG. 5 illustrates a block diagram of another radio receiver according to an exemplary embodiment of the present invention.

FIG. 5 illustrates a block diagram of another radio receiver according to an exemplary embodiment of the present invention. A radio receiver 500 operates on the received communications signals 250.1 through 250.N as captured from a communication channel, such as the communication channel 104 to provide an example, by receiving antennas 202.1 through 202.N to produce downconverted communications signals 252.1 through 252.N. For example, the radio receiver 500 may downconvert the received communications signals 250.1 through 250.N to baseband or any suitable intermediate frequency (IF) to produce the downconverted communications signals 252.1 through 252.N. The radio receiver 500 may additionally perform functions such as, but not limited to, filtering, and/or automatic gain control (AGC). The radio receiver 500 may represent an exemplary embodiment of the radio receiver 204 as shown in FIG. 2.

The radio receiver 500 includes radio receiver chains 502.1 through 502.N, each radio receiver chain is configured to receive a corresponding received communications signal 250.1 through 250.N and to produce a corresponding downconverted communications signal 252.1 through 252.N. In an exemplary embodiment, each receiving antenna 202.1 through 202.N is coupled to a corresponding radio receiver chain 502.1 through 502.N. However, this example is not limiting, those skilled in the relevant art(s) will recognize that receiving antenna 202.1 through 202.N may be coupled to at least one corresponding radio receiver chain 502.1 through 502.N without departing from the spirit and scope of the present invention. The radio receiver chains 502.1 through 502.N operate in a substantially similar manner as the radio receiver chains 502.1 through 502.N. Only differences between the radio receiver chain 402.1 and the radio receiver chain 502.1 are to be discussed in further detail.

The radio receiver chain 502.1 includes a first combination module 504.1, a first variable low pass filter 506.1, a second combination module 508.1, and a second variable low pass filter 510.1. The first combination module 504.1 produces a highpass filtered communications signal 552.1 by combining the downconverted communications signal 452.1 and a lowpass filtered communications signal 556.1 to be discussed below. More specifically, the first combination module 504.1 subtracts the lowpass filtered communications signal 556.1 from the downconverted communications signal 452.1 to produce the highpass filtered communications signal 552.1.

The radio receiver filter 408.1, as discussed in FIG. 4, filters the highpass filtered communications signal 552.1 to produce a bandpass filtered communications signal 554.1.

The first variable low pass filter 506.1 produces the lowpass filtered communications signal 556.1 based on the bandpass filtered communications signal 554.1. Similar to the radio receiver filter 408.1, the first variable low pass filter 506.1 may select among one or more first variable low pass filter bandwidths to filter the at least one single stream signal field and/or the at least one multiple stream signal field. For example, the first variable low pass filter 506.1 may select at least one of a variable filter training sequence bandwidth to filter the single stream preamble and/or the multiple stream preamble and/or a variable filter information payload bandwidth to filter the single stream information payload and/or the multiple stream information payload. Both the variable filter training sequence bandwidth and the variable filter information payload bandwidth are further discussed in disclosed in U.S. patent application Ser. No. 12/213,179, filed Jun. 16, 2008, which is incorporated by reference in its entirety.

The PHY 300 may dynamically reconfigure the first variable low pass filter 506.1 to support the one or more other single stream modes of operation, multiple stream modes of operation, and/or propriety modes of operation. The PHY 300 may dynamically select a first variable receiver filter bandwidth based on the single stream mode of operation, the multiple stream mode of operation, and/or the propriety mode of operation among one or more first variable receiver filter bandwidths to reconfigure the first variable low pass filter 506.1. More specifically, the first variable low pass filter 506.1 is configured to filter the bandpass communications signal 554.1 based on a first variable receiver filter bandwidth among the one or more first variable receiver filter bandwidths corresponding to a first single stream mode of operation, multiple stream mode of operation, and/or propriety mode of operation. For example, the PHY 300 may reconfigure the first variable low pass filter 506.1 to adjust the first variable receiver filter bandwidth from the first variable receiver filter bandwidth corresponding to the 20 MHz single stream mode of operation, multiple stream mode of operation, and/or propriety mode of operation to the second variable receiver filter bandwidth corresponding to the 10 MHz single stream mode of operation, multiple stream mode of operation, and/or propriety mode of operation. The first variable low pass filter 506.1 may filter the bandpass communications signal 554.1 based on the second receive filter bandwidth corresponding to the second mode of operation.

The second combination module 508.1 produces a highpass amplified communications signal 558.1 by combining the bandpass communications signal 554.1 and a lowpass amplified communications signal 560.1 to be discussed below. More specifically, the second combination module 508.1 subtracts the lowpass amplified communications signal 560.1 from the bandpass communications signal 554.1 to produce the highpass amplified communications signal 558.1.

The VGA 410.1, as discussed in FIG. 4, amplifies or attenuates the highpass amplified communications signal 558.1 by a VGA gain, denoted as $VGA_1$ in FIG. 5, to produce the downconverted communications signal 252.1.

The second variable low pass filter 510.1 produces the lowpass filtered communications signal 560.1 based on the downconverted communications signal 252.1. Similar to the radio receiver filter 408.1, the second variable low pass filter 510.1 may select among one or more second variable low pass filter bandwidths to filter the at least one single stream signal field and/or the at least one multiple stream signal field. For example, the second variable low pass filter 510.1 may select at least one of the variable filter training sequence bandwidth to filter the single stream preamble and/or the multiple stream preamble and/or the variable filter information payload bandwidth to filter the single stream information payload and/or the multiple stream information payload. Both the variable filter training sequence bandwidth and the variable filter information payload bandwidth are further discussed in disclosed in U.S. patent application Ser. No. 12/213,179, filed Jun. 16, 2008, which is incorporated by reference in its entirety.

The PHY 300 may dynamically reconfigure the second variable low pass filter 510.1 to support the one or more other single stream modes of operation, multiple stream modes of operation, and/or propriety modes of operation. The PHY 300 may dynamically select a second variable receiver filter bandwidth based on the single stream mode of operation, the multiple stream mode of operation, and/or the propriety mode of operation among one or more second variable receiver filter bandwidths to reconfigure the second variable low pass filter 510.1. The PHY 300 may dynamically adjust the second variable receiver filter bandwidth from the first variable receiver filter bandwidth to a second variable receiver filter bandwidth among the one or more second variable receiver filter bandwidths corresponding to a second single stream mode of operation, multiple stream mode of operation, and/or propriety mode of operation. For example, the PHY 300 may reconfigure the second variable low pass filter 510.1 to adjust the second variable receiver filter bandwidth from the first variable receiver filter bandwidth corresponding to the 20 MHz single stream mode of operation, multiple stream mode of operation, and/or propriety mode of operation to the second variable receiver filter bandwidth corresponding to the 10 MHz single stream mode of operation, multiple stream mode of operation, and/or propriety mode of operation. The second variable low pass filter 510.1 may filter the downconverted communication signals 252.1 based on the second receive filter bandwidth corresponding to the second mode of operation.

A combination of the first combination module 504.1 and the first variable low pass filter 506.1 and a combination of the second combination module 508.1 and the second variable low pass filter 510.1 represents a first variable highpass filter and a second variable highpass filter respectfully. In other words, the first combination module 504.1 subtracts spectral components not attenuated by the first variable low pass filter to substantially high pass filter the downconverted communications signal 452.1. Likewise, the second combination module 508.1 subtracts spectral components not attenuated by the second variable low pass filter to substantially high pass filter the bandpass communications signal 554.1.

The PHY 300 may also dynamically reconfigure the PHY receiver filter 304 to support the one or more other single stream modes of operation, multiple stream modes of operation, and/or propriety modes of operation. The PHY 300 may dynamically select a PHY receiver filter bandwidth based on the single stream mode of operation, the multiple stream mode of operation, and/or the propriety mode of operation among one or more PHY receiver filter bandwidths to reconfigure the PHY receiver filter 304. More specifically, the PHY receiver filter 304 is configured to filter the digital communication signals 350.1 through 350.N based on a first PHY receiver filter bandwidth among the one or more PHY receiver filter bandwidths corresponding to a first single stream mode of operation, multiple stream mode of operation, and/or propriety mode of operation. The PHY 300 may dynamically adjust the PHY receiver filter bandwidth from the first PHY receiver filter bandwidth to a second PHY receiver filter bandwidth among the one or more PHY receiver filter bandwidths corresponding to a second single stream mode of operation, multiple stream mode of operation, and/or propriety mode of operation. For example, the PHY 300 may reconfigure the PHY receiver filter 304 to adjust the PHY receiver filter bandwidth from the first PHY receiver filter bandwidth corresponding to the 20 MHz single stream mode of operation, multiple stream mode of operation, and/or propriety mode of operation to the second PHY receiver filter bandwidth corresponding to the 10 MHz single stream mode of operation, multiple stream mode of operation, and/or propriety mode of operation. The PHY receiver filter 304 may filter the digital communication signals 350.1 through 350.N based on the second radio receive filter bandwidth corresponding to the second mode of operation.

Exemplary Multiple Stream Baseband Processing Module

Figure 6:
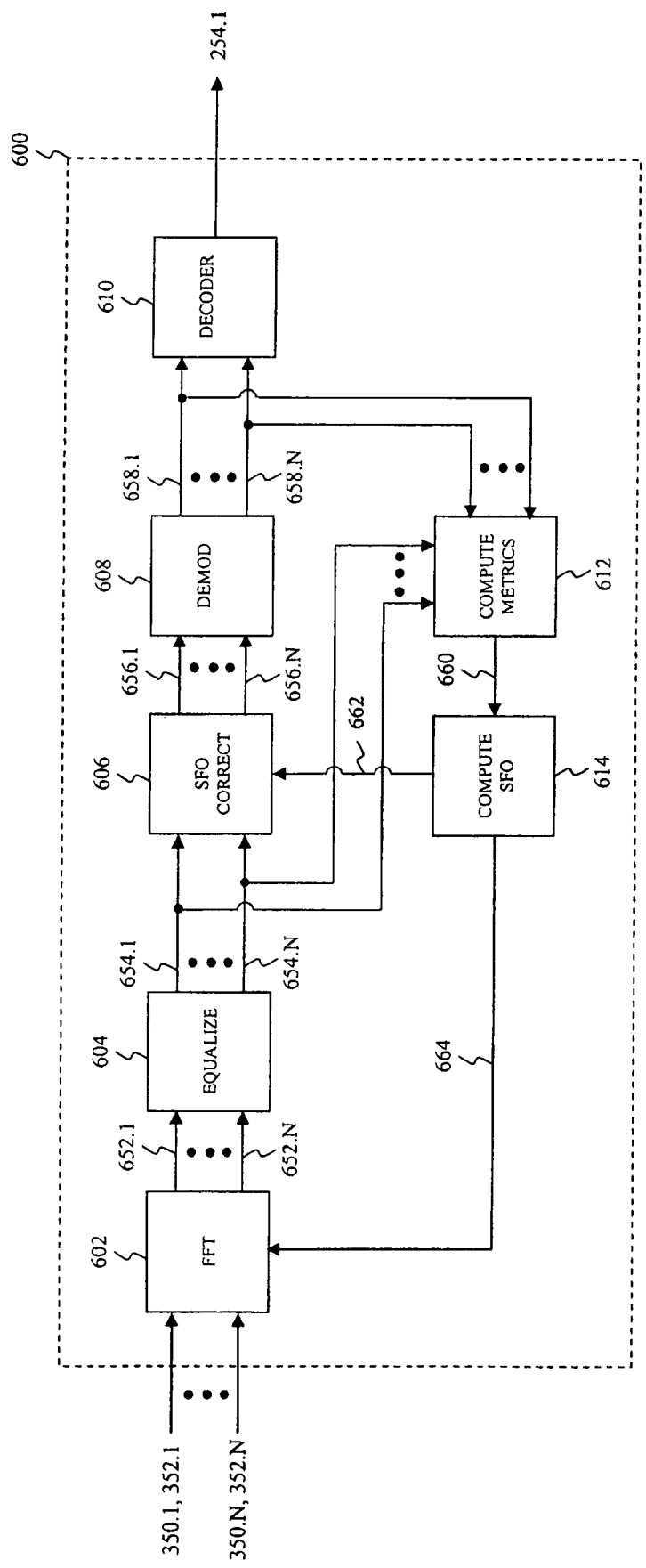
FIG. 6 illustrates a block diagram of a multiple stream baseband processing module according to an exemplary embodiment of the present invention.

The PHY 300 may further dynamically reconfigure the multiple stream baseband processing module 306 to support the one or more other single stream modes of operation, multiple stream modes of operation, and/or propriety modes of operation. FIG. 6 illustrates a block diagram of a multiple stream baseband processing module according to an exemplary embodiment of the present invention. A multiple stream baseband processing module 600 may represent an exemplary embodiment of the multiple stream baseband processing module 306 as discussed in conjunction with FIG. 3. The multiple stream baseband processing module 600 produces the decoded communications signal 254.1 based on the digital communication signals 350.1 through 350.N and/or the encoded multiple stream communication signals 352.1 through 352.N.

The multiple stream baseband processing module includes a Fast-Fourier Transform (FFT) calculation module 602, an equalization module 604, a sampling frequency offset (SFO) compensation module 606, a demodulator 608, a decoding module 610, a signal metric computational module 612, and a SFO computational module 614. The FFT calculation module 602 transforms the digital communication signals 350.1 through 350.N and/or the encoded multiple stream communication signals 352.1 through 352.N from a time domain representation into a frequency domain representation to produce frequency domain communication signals 652.1 through 652.N. More specifically, the FFT calculation module 602 transforms the digital communication signals 350.1 through 350.N and/or the encoded multiple stream communication signals 352.1 through 352.N based upon well known FFT algorithms, such as, but not limited to, the Cooley-Tukey FFT algorithm, the Split-radix FFT algorithm, the Prime-factor FFT algorithm to provide some examples. The FFT calculation module 602 may advance or increase and/or retard or decrease one of the digital communication signals 350.1 through 350.N and/or one of the encoded multiple stream communication signals 352.1 through 352.N by one or more samples based upon a sampling frequency offset compensation signal 664 to be discussed below.

The equalization module 604 compensates for interference and/or distortion embedded in the frequency domain communication signals 652.1 through 652.N to produce equalized communication signals 654.1 through 654.N. More specifically, the equalization module 604 reduces an effect of interference and/or distortion attributable to a communication channel, such as the communication channel 104, a communications transmitter, such as the communications transmitter 102 or the communications transmitter 108, and/or a communications receiver, such as the communications receiver 106 embedded in the frequency domain communication signals 652.1 through 652.N. For example, a propagation medium of the communication channel may introduce interference and/or distortion into a transmitted communication signal, such as the transmitted communication signal 152 and/or the transmitted communication signals 162.1 through 162.I to provide some examples, causing a received communication signal, such as the received communication signals 154.1 through 154.N and/or the received communication signals 164.1 through 164.N to differ from the transmitted communication signal.

The SFO compensation module 606 adjusts the equalized communication signals 654.1 through 654.N to produce compensated communication signals 656.1 through 656.N. More specifically, the SFO compensation module 606 may advance or increase and/or retard or decrease one of the equalized communication signals 654.1 through 654.N based upon a sampling frequency offset compensation signal 662 to be discussed below.

The demodulator module 608 demodulates the compensated communication signals 656.1 through 656.N to produce demodulated communication signals 658.1 through 658.N according to the known multiple stream communications standard. Likewise, the decoding module 610 decodes the demodulated communication signals 658.1 through 658.N to produce the decoded communication signal 254.1 according to the known multiple stream communications standard and/or the proprietary communications protocol. In an exemplary embodiment, the decoding module 610 decodes the demodulated communication signals 658.1 through 658.N according to a Verturbi decoding scheme.

The signal metric computational module 612 calculates or gathers at least one signal metric to produce a calculated signal metric 660. However, this example is not limiting, those skilled in the relevant art(s) will recognize that the calculated signal metric 660 may include more than one signal metric without departing from the spirit and scope of the present invention. The signal metric computational module 612 calculates at least one signal metric, such as but not limited to, the sampling frequency offset, the mean, the total energy, the average power, the mean square, the instantaneous power, the root mean square, the variance, the norm, and/or any other suitable signal metric to provide some examples, based upon the equalized communication signals 654.1 through 654.N and/or the demodulated communication signals 658.1 through 658.N.

The SFO computational module 614 produces the sampling frequency offset compensation signal 662 and/or the sampling frequency offset compensation signal 664 based upon the calculated signal metric 660. More specifically, the SFO computational module 614 calculates a sampling frequency offset based on calculated signal metric 660. When the sampling frequency offset is less than a sampling frequency offset threshold, the SFO computational module 614 communicates the sampling frequency offset to the SFO compensation module 606 via the sampling frequency offset compensation signal 662 to advance and/or retard one of the equalized communication signals 654.1 through 654.N. In an exemplary embodiment, the sampling frequency offset threshold is substantially equal to a duration of half a sample. Alternatively, when the sampling frequency offset is greater than the sampling frequency offset threshold, the SFO computational module 614 communicates the sampling frequency offset to FFT calculation module 602 via the sampling frequency offset compensation signal 664 to advance and/or retard one of one of the digital communication signals 350.1 through 350.N and/or one of the encoded multiple stream communication signals 352.1 through 352.N by one or more samples.

The PHY 300 may further dynamically reconfigure the SFO compensation module 606, the signal metric computational module 612, and/or the SFO computational module 614 to support the one or more other modes of operation based on the single stream mode of operation, multiple stream mode of operation, and/or propriety mode of operation. More specifically, the PHY 300 may adjust the SFO compensation value from a first SFO compensation value corresponding to a first single stream mode of operation, multiple stream mode of operation, and/or propriety mode of operation to a second SFO compensation value corresponding to a second single stream mode of operation, multiple stream mode of operation, and/or propriety mode of operation. For example, the single stream mode of operation, multiple stream mode of operation, and/or propriety mode of operation may provide for a symbol duration of 4 μs corresponding to the 20 MHz single stream mode of operation, multiple stream mode of operation, and/or propriety mode of operation. However, the 10 MHz single stream mode of operation, multiple stream mode of operation, and/or propriety mode of operation corresponds to a symbol duration of 8 μs. This increase in symbol duration increases a total phase accumulation due to SFO. Unless the SFO compensation is adjusted from the first SFO compensation value to the second SFO compensation value, a constellation diagram of the compensated communication signals 656.1 through 656.N may spin.

The PHY 300 may yet further dynamically reconfigure the clock 358 to support the one or more other single stream modes of operation, multiple stream modes of operation, and/or propriety modes of operation. The clock 358 may operate at a first nominal operating frequency corresponding to a first single stream mode of operation, multiple stream mode of operation, and/or propriety mode of operation. The PHY 300 may adjust the operating frequency of the clock 358 from the first nominal operating frequency to a second nominal operating frequency corresponding to a second single stream mode of operation, multiple stream mode of operation, and/or propriety mode of operation. For example, the PHY 300 may adjust the clock 358 from 40 MHz corresponding to the 20 MHz single stream mode of operation, multiple stream mode of operation, and/or propriety mode of operation to 20 MHz corresponding to the 10 MHz single stream mode of operation, multiple stream mode of operation, and/or propriety mode of operation. The PHY 300 may process the downconverted communication signals 252.1 through 252.N based on the second nominal operating frequency.

Propriety Communications Protocols

The reconfiguration of the PHY 300 from a first mode of operation to a second mode of operation, as described above, allows for a reconfiguration of the known single stream communications standard and/or the known multiple stream communications standard to generate communications standards that are not defined in the known single stream communications standard and/or the known multiple stream communications standard, herein referred to as the propriety communications protocols. More specifically, the PHY 300 may operate according to a first mode of operation having a standard defined signal channel bandwidth corresponding to the known single stream communications standard, and/or the known multiple stream communications standard and may be configured to support a second mode of operation having either the standard defined signal channel bandwidth and/or a non-standard defined signal channel bandwidth that does not correspond to the known single stream communications standard, and/or the known multiple stream communications standard, referred to as the propriety communications protocols. For example, a PHY 300 operating according to the IEEE 802.11a™ standard having a standard defined signal channel bandwidth of 20 MHz may be reconfigured to support the IEEE 802.11j™ standard having a standard defined signal channel bandwidth of 10 MHz. Likewise, a PHY 300 operating according to the IEEE 802.11g™ standard having a standard defined signal channel bandwidth of 20 MHz may be reconfigured to support a propriety communications protocol having a non-standard defined signal channel bandwidth of 10 MHz. Similarly, a PHY 300 operating according to the IEEE 802.11n™ standard having a standard defined signal channel bandwidth of 20 MHz may be reconfigured to support a propriety communications protocol having a non-standard defined signal channel bandwidth of 10 MHz. However, these examples are not limiting, those skilled in the relevant art(s) will recognize that the PHY 300 may be configured to support any standard defined signal channel bandwidth and may be reconfigured to support either another standard defined signal channel bandwidth and/or the non-standard defined signal channel bandwidth without departing from the spirit and scope of the present invention.

The dynamic reconfiguration of the PHY 300 allows the communications receiver 106 to select among one or more single stream modes of operation, multiple stream modes of operation, and/or propriety modes of operation to optimize a data rate and/or a range of the communications receiver 106 based on the least one signal metric. More specifically, the PHY 300 may be configured to support a first single stream mode of operation, multiple stream mode of operation, and/or propriety mode of operation. The PHY 300 may monitor the least one signal metric to determine a data rate and/or a range for the first single stream mode of operation, multiple stream mode of operation, and/or propriety mode of operation. The PHY 300 may be reconfigured to support a second single stream mode of operation, multiple stream mode of operation, and/or propriety mode of operation if the least one signal metric is above and/or below a corresponding signal metric threshold. The PHY 300 may be reconfigured from the first single stream mode of operation, multiple stream mode of operation, and/or propriety mode of operation having a greater signal channel bandwidth to the second single stream mode of operation, multiple stream mode of operation, and/or propriety mode of operation having a lesser signal channel bandwidth to increase the range of the communications receiver 106. For example, when the PHY 300 determines that the least one signal metric is below a signal metric threshold corresponding to a data throughput indicating the communications receiver 106 is out of range, the PHY 300 may reconfigure itself from the 20 MHz single stream mode of operation, multiple stream mode of operation, and/or propriety mode of operation to the 10 MHz single stream mode of operation, multiple stream mode of operation, and/or propriety mode of operation according to the propriety communications protocols to decrease the data rate by two, thereby increasing the range of the communications receiver 106 by two. Likewise, when the PHY 300 determines that the least one signal metric is above a signal metric threshold corresponding to a data throughput indicating the communications receiver 106 includes excess range, the PHY 300 may reconfigure itself from the 20 MHz single stream mode of operation, multiple stream mode of operation, and/or propriety mode of operation to a 40 MHz single stream mode of operation, multiple stream mode of operation, and/or propriety mode of operation, to increase the data rate by two, thereby decreasing the range of the communications receiver 106 by two.

The PHY 300 may communicate to a communications transmitter, such as the communications transmitter 102 and/or the communications transmitter 108 to provide some examples, of the reconfiguration from the first single stream mode of operation, multiple stream mode of operation, and/or propriety mode of operation to the second single stream mode of operation, multiple stream mode of operation, and/or propriety mode of operation to allow the communications transmitter to transmit a transmitted communication signal, such as the transmitted communication signal 152 and/or the transmitted communication signals 162.1 through 162.I to provide some examples, according to the to the second single stream mode of operation, multiple stream mode of operation, and/or propriety mode of operation.

Exemplary Operation of the Communications Environments

Figure 7:
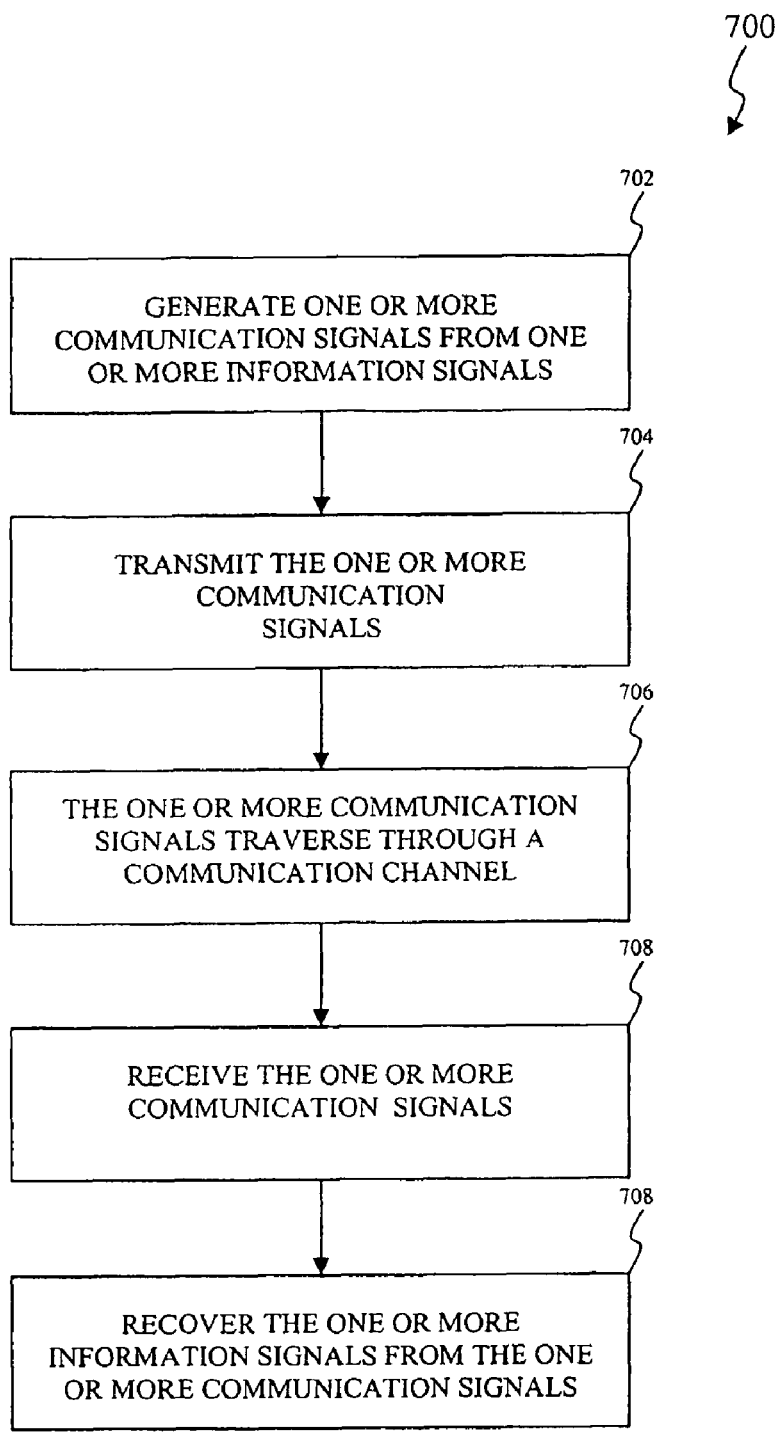
FIG. 7 is a flowchart of exemplary operational steps of a communications environment according to an aspect of the present invention.

FIG. 7 is a flowchart 700 of exemplary operational steps of a communications environment according to an aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 7.

At step 702, one or more communications signals, such as the transmitted communications signal 152 and/or the transmitted communications signal 162.1 through 162.I, are generated from one or more information signals as received from one or more transmitter user devices, such as the information signals 150.1 through 150.K and/or the information signals 160.1 through 160.K. More specifically, the one or more information signals are encoded according to a known single stream communications standard, such as, but not limited to, the IEEE 802.11a™ standard, the IEEE 802.11b™ standard, the IEEE 802.11g™ standard, and/or any other suitable single stream communications standard, a known multiple stream communications standard, such as, but not limited to, the IEEE 802.11n™ standard, a proprietary communications standard, and/or any other suitable multiple stream communications standard to produce the one or more communications signals.

At step 704, the one or more communications signals from step 702 is transmitted as a single stream communications signal according to the known single stream communications standard to produce the one or more communications signals from step 702 Alternatively, the one or more communications signals from step 702 are transmitted as a multiple stream communications signal according to the known multiple stream communications standard. As another alternative, the one or more communications signals from step 702 are transmitted as a single stream communications signal and/or a multiple stream communications signal according to the proprietary communications standard.

At step 706, the one or more communications signals from step 704 traverse through a communication channel, such as the communication channel 74. The communication channel may include, but is not limited to, a microwave radio link, a satellite channel, a fiber optic cable, a hybrid fiber optic cable system, or a copper cable to provide some examples. The communication channel contains a propagation medium that the one or more communications signals from step 704 pass through before reception. The propagation medium of the communication channel introduces interference and/or distortion into the communications signal. For example, noise such as, but not limited to, thermal noise, burst noise, impulse noise, interference, signal strength variations known as fading, phase shift variations, to provide some examples, may introduce interference and/or distortion into the communications signal. In addition, the propagation medium of the communication channel may cause the one or more communications signals to propagate onto multiple communication paths, reflecting from different objects, surface areas, surface boundaries, and interfaces in the communications environment. Potential causes of multipath propagation may include, but are not limited, to atmospheric ducting, ionospheric reflection and/or refraction, and/or reflection from terrestrial objects such as mountains and/or buildings to provide some examples.

At step 708, the one or more communications signals from step 706 are received. The one or more communications signals from step 706 are received as either a single stream communications signal and/or a multiple stream communications signal. The multiple communication paths traversed by the one or more communications signals from step 706 resulting from the multipath propagation introduced by the communication channel may be received. For example, the multiple communication paths of the one or more communications signals from step 706 transmitted as the single stream communications signal may be received as it traverses through the communication channel. Likewise, the multiple communication paths of the one or more communications signals from step 706 transmitted as the multiple stream communications signal may be received as it traverses through the communication channel.

At step 710, one or more information signals, such as the recovered information signals 156.1 through 156.K and/or the recovered information signals 166.1 through 166.K to provide some examples, are recovered from the one or more communications signals from step 708 to produce one or more recovered information signals. The one or more communications signals from step 708 are operated upon according to the known single stream communications standard, the known multiple stream communications standard, and/or the proprietary communications standard to recover the one or more information signals.

Exemplary Operation of the Communications Receiver

Figure 8:
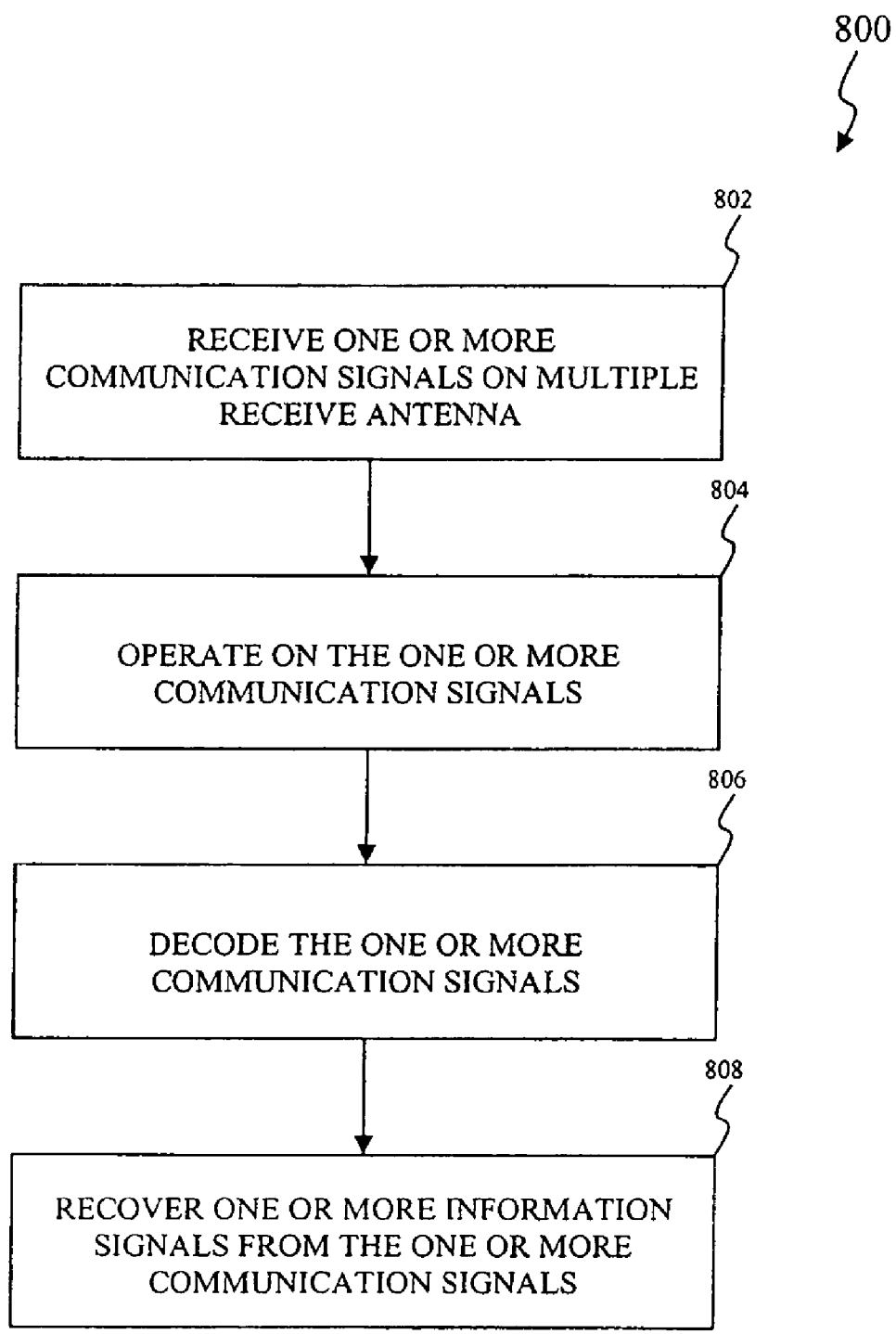
FIG. 8 is a flowchart of exemplary operational steps of a communications receiver according to an aspect of the present invention.

FIG. 8 is a flowchart 800 of exemplary operational steps of a communications receiver according to an aspect of the present invention. In other words, FIG. 8 further defines steps 708 and 710 as shown in FIG. 7. The invention is not limited to this operational description. Rather, it will be apparent to persons skilled in the relevant art(s) from the teachings herein that other operational control flows are within the scope and spirit of the present invention. The following discussion describes the steps in FIG. 8.

At step 802, one or more communications signals, such the received communications signals 154.1 through 154.N and/or the received communications signals 164.1 through 164.N to provide some examples, are received to produce one or more received communications signals, such as the received communications signals 250.1 through 250.N to provide some examples. More specifically, the one or more communications signals are received as they traverse through a communication channel, such as the communication channel 104. The one or more communications signals may include one or more single stream communications signals, one or more multiple stream communications signals, and/or any combination thereof.

At step 804, the one or more communications signals from step 802 are operated on to produce one or more downconverted communications signals, such as the downconverted communications signals 252.1 through 252.N to provide an example. For example, the one or more communications signals from step 802 may be downconverted to baseband or any suitable intermediate frequency (IF) to produce the downconverted communications signals. However, those skilled in the relevant art(s) will recognize that step 804 is optional, the operational control may flow directly from step 802 to step 806 for a baseband and/or a near baseband communication.

At step 806, the one or more communications signals from step 804 are decoded to produce one or more decoded communications signals, such as the decoded communications signals 254.1 through 254.M to provide an example. Alternatively, the one or more communications signals from step 802 may be directly decoded to produce the one or more decoded communications signals. More specifically, the one or more communications signals from step 802 and/or the one or more communications signals from step 804 are decoded to produce the one or more decoded communications signals according to the known single stream communications standard, the known multiple stream communications standard, and/or the proprietary communications standard. If the one or more communications signals from step 802 and/or the one or more communications signals from step 804 includes the single stream communications signal, the one or more communications signals from step 802 and/or the one or more communications signals from step 804 are decoded according to the known single stream communications standard and/or the proprietary communications standard. If the one or more communications signals from step 802 and/or the one or more communications signals from step 804 includes the multiple stream communications signal, the one or more communications signals from step 802 and/or the one or more communications signals from step 804 are decoded according the known multiple stream communications standard, and/or the proprietary communications standard.

At step 808, one or more information signals, such as the recovered information signals 256.1 through 256.K to provide an example, are recovered by operating on the communications signal from step 806 according to the known single stream communications standard, the known multiple stream communications standard, and/or the proprietary communications standard.

Figure 9:
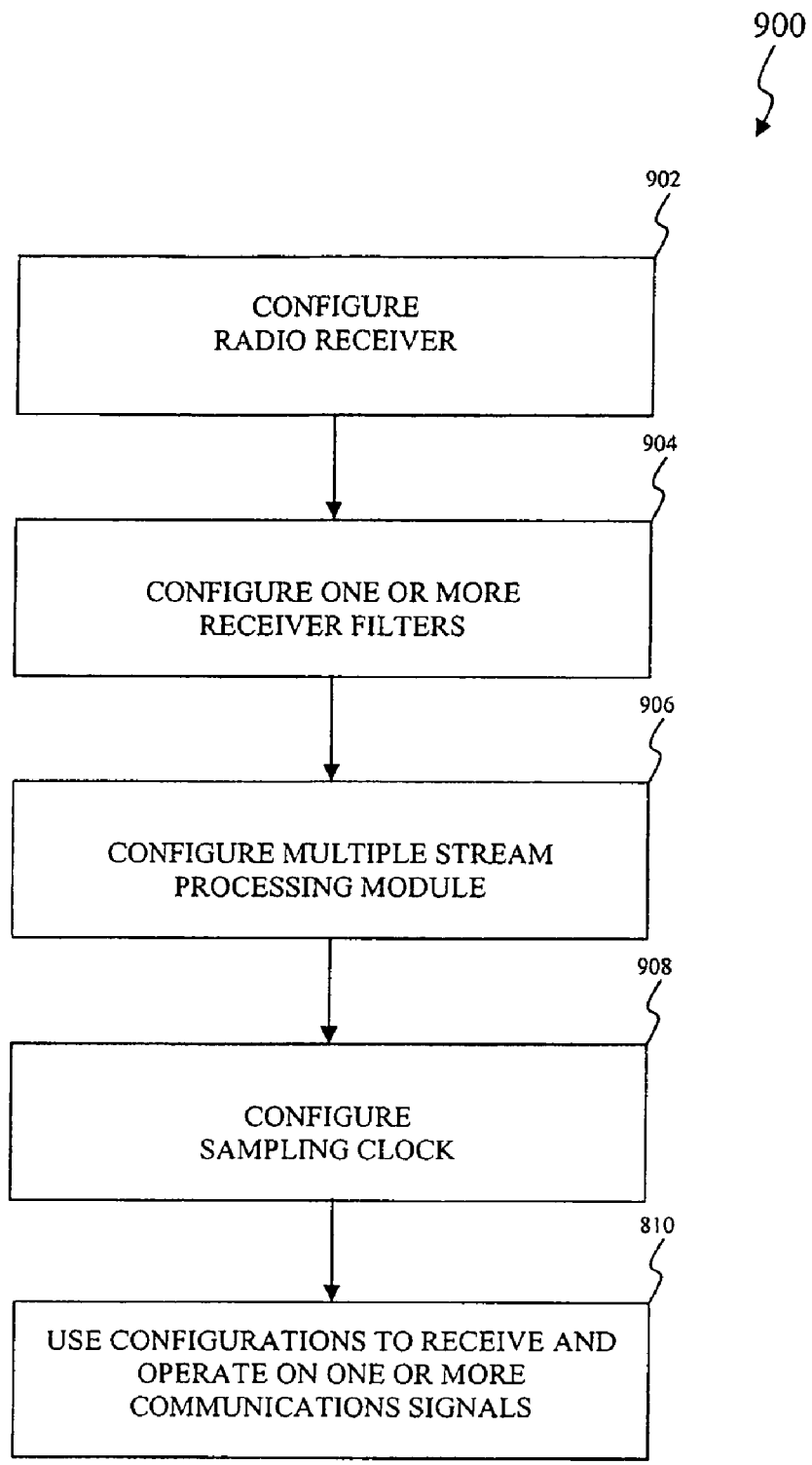
FIG. 9 is a flowchart 900 of exemplary operational steps to configure a PHY according to another aspect of the present invention.

FIG. 9 is a flowchart 804 of exemplary operational steps to configure a PHY according to another aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 9.

At step 902, the radio receiver is configured based on the single stream mode of operation, the multiple stream mode of operation, and/or the propriety mode of operation. The radio receiver may include one or more radio receiver filters, such as the radio receiver filters 408.1 through 408.N, the first variable low pass filters 506.1 through 506.N, and/or the second variable low pass filters 510.1 through 510.N to provide some examples. The one or more radio receiver filters may be dynamically configured to support the one or more other single stream modes of operation, multiple stream modes of operation, and/or propriety modes of operation. One or more first receiver filter bandwidths may be selected based on the single stream mode of operation, the multiple stream mode of operation, and/or the propriety mode of operation. The one or more receiver filter bandwidths may be dynamically adjusted from the one or more first receiver filter bandwidths to one or more second receiver filter bandwidths corresponding to a second single stream mode of operation, multiple stream mode of operation, and/or propriety mode of operation.

At step 904, the PHY receiver filter may be dynamically configured based on the single stream mode of operation, the multiple stream mode of operation, and/or the propriety mode of operation. The one or more PHY receiver filters may be dynamically configured to support the one or more other single stream modes of operation, multiple stream modes of operation, and/or propriety modes of operation. One or more first PHY receiver filter bandwidths may be selected based on the single stream mode of operation, the multiple stream mode of operation, and/or the propriety mode of operation. The one or more first PHY receiver filter bandwidths may be dynamically adjusted from the one or more first PHY receiver filter bandwidths to one or more second PHY receiver filter bandwidths corresponding to a second single stream mode of operation, multiple stream mode of operation, and/or propriety mode of operation.

At step 906, the multiple stream baseband processing module may be dynamically configured based on the single stream mode of operation, the multiple stream mode of operation, and/or the propriety mode of operation. The multiple stream baseband processing module is configured to compensate for SFO according to a corresponding SFO compensation value based on the single stream mode of operation, the multiple stream mode of operation, and/or the propriety mode of operation.

At step 908, the sampling clock based may be configured based on the single stream mode of operation, the multiple stream mode of operation, and/or the propriety mode of operation. More specifically, an operating frequency of the sampling clock may be configured to a nominal operating frequency based on the single stream mode of operation, the multiple stream mode of operation, and/or the propriety mode of operation. For example, the operating frequency of the sampling clock may be configured to 40 MHz corresponding to the 20 MHz single stream mode of operation, multiple stream mode of operation, and/or propriety mode of operation or to 20 MHz corresponding to the 10 MHz single stream mode of operation, multiple stream mode of operation, and/or propriety mode of operation.

At step 910, the one or more communications signals from step 802 are received and operated on in step 804 using at least one of the configurations from steps 902 through 908.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined according to the following claims and their equivalents.

What is claimed is:

1. A communications receiver configured to support a first mode of operation having a first signal channel bandwidth and a second mode of operation having a second signal channel bandwidth, the first signal channel bandwidth being different from the second signal channel bandwidth, comprising:
a plurality of baseband processing modules configured to process a first plurality of communications signals, characterized as having the first signal channel bandwidth, in accordance with a sampling clock that is characterized by a first operating frequency in the first mode of operation,
wherein the sampling clock is dynamically configurable from the first operating frequency to a second operating frequency to allow the plurality of baseband processing modules to process a second plurality of communications signals in the second mode of operation, the second plurality of communications signals being characterized as having the second signal channel bandwidth.

2. The communications receiver of claim 1, wherein the first signal channel bandwidth is a standard defined signal channel bandwidth.

3. The communications receiver of claim 2, wherein the standard defined signal channel bandwidth corresponds to at least one selected from a group consisting of:
a single stream mode of operation; and
a multiple stream mode of operation.

4. The communications receiver of claim 1, wherein the second signal channel bandwidth is at least one selected from a group consisting of:
a standard defined signal channel bandwidth; and
a non-standard defined signal channel bandwidth.

5. The communications receiver of claim 4, wherein the standard defined signal channel bandwidth corresponds to at least one selected from a group consisting of:
a single stream mode of operation; and
a multiple stream mode of operation.

6. The communications receiver of claim 4, wherein the non-standard defined signal channel bandwidth corresponds to a proprietary communications protocol.

7. The communications receiver of claim 1, wherein at least one of the plurality of baseband processing modules is configured to process the first plurality of communications signals using a multiple stream communications standard, the multiple stream communications standard including at least one selected from a group consisting of:
a known multiple stream communications standard; and
a proprietary communications protocol.

8. The communications receiver of claim 7, wherein the known multiple stream communications standard includes an Institute of Electrical and Electronics Engineers (IEEE) 802.11n™ standard.

9. The communications receiver of claim 1, wherein the single stream communications standard includes at least one selected from a group consisting of:
a known single stream communications standard; and
a proprietary communications protocol.

10. The communications receiver of claim 9, wherein the known single stream communications standard includes at least one selected from a group consisting of:
an Institute of Electrical and Electronics Engineers (IEEE) 802.11a™ standard;
an IEEE 802.11b™ standard;
an IEEE 802.11j™ standard; and
an IEEE 802.11g™ standard.

11. A communications receiver configured to support a first mode of operation and a second mode of operation, comprising:
a radio receiver configured to downconvert one or more communications signals to produce one or more downconverted communications signals, the radio receiver including:
a low noise amplifier configured to amplify the one or more communications signals to produce one or more attenuated communications signals;
a mixer configured to downconvert the attenuated communications signal to produce one or more downconverted communications signals;
a first combination module configured to combine the one or more downconverted communications signals and one or more lowpass filtered communications signals to produce one or more highpass filtered communications signals;
a radio receiver filter configured to filter the one or more highpass filtered communications signal to produce one or more bandpass filtered communications signals;
a first variable low pass filter configured to filter the one or more highpass amplified communications signals to produce the one or more lowpass filtered communications signals;
a second combination module configured to combine the one or more bandpass communications signals and the one or more lowpass amplified communications signals to produces one or more highpass amplified communications signals;
a variable gain amplifier (VGA) configured to amplify the highpass amplified communications signal to produce the one or more downconverted communications signals; and
a second variable low pass filter configured to filter the one or more downconverted communications signals to produce the one or more lowpass amplified communications signals, wherein at least one of the radio receiver filter, the first variable low pass filter, and the second variable low pass filter is dynamically configurable to support the first mode of operation and the second mode of operation;
an analog to digital converter (ADC) configured to convert the one or more downconverted communications signals from an analog representation to a digital representation to produce one or more digital communications signals based on a sampling clock;

a receiver filter configured to filter the one or more digital communications signals to produce one or more encoded multiple stream communications signals based on the sampling clock;

multiple stream baseband processing module configured to process the one or more encoded communications signals using a multiple stream communications standard based on the sampling clock; and single stream baseband processing module configured to process at least one of the one or more digital communications signals and the one or more encoded multiple stream communications signals using a single stream communications standard based on the sampling clock, wherein at least one of the receiver filter, multiple stream baseband processing module, and the sampling clock is dynamically configurable to support the first mode of operation and the second mode of operation.

12. The communications receiver of claim 11, wherein at least one selected from a group consisting of:
the radio receiver filter;
the first variable low pass filter; and
the second variable low pass filter;
is configured to adjust a bandwidth from a first filter bandwidth corresponding to the first mode of operation to a second filter bandwidth corresponding to the second mode of operation.

13. A method for dynamically reconfiguring a communications receiver from a first mode of operation having a first signal channel bandwidth to a second mode of operation having a second signal channel bandwidth, the first signal channel bandwidth being different from the second signal channel bandwidth, comprising:
(A) configuring the communications receiver to process a first plurality of communications signals, characterized as having the first signal channel bandwidth, in accordance with a sampling clock that is characterized by a first operating frequency in the first mode of operation;
(B) processing the first plurality of communications signals using the sampling clock; and
(C) reconfiguring the sampling clock from the first operating frequency to a second operating frequency to allow for processing of a second plurality of communications signals in the second mode of operation, the second plurality of communications signals being, characterized as having the second signal channel bandwidth.

14. The method of claim 13, wherein the first signal channel bandwidth is a standard defined signal channel bandwidth.

15. The method of claim 14, wherein the standard defined signal channel bandwidth corresponds to at least one selected from a group consisting of:
a single stream mode of operation; and
a multiple stream mode of operation.

16. The method of claim 13, wherein step (A) comprises:
(A)(i) configuring the communications receiver to support at least one selected from a group consisting of:
a standard defined mode of operation; and
a non-standard channel bandwidth.

17. The method of claim 16, wherein step (A)(i) comprises:
(A)(i)(1) configuring the communications receiver to support at least one selected from a group consisting of:
a known single; stream communications; and
a known multiple stream communications standard.

18. The method of claim 16, wherein step (A)(i) comprises:
(A)(i)(1) configuring the communications receiver to support a proprietary communications protocol.

19. The method of claim 13, wherein step (B) comprises:
(B)(i) processing the first plurality of communications signals using at least one selected from a group consisting of:
a known multiple stream communications standard; and
a proprietary communications protocol.

20. The method of claim 19, wherein step (B)(i) comprises:
(B)(i)(1) processing the first plurality of communications signals using an IEEE 802.11n™ standard.

21. The method of claim 13, wherein step (B) comprises:
(B)(i) processing at least one of the first plurality of communications signals using, at least one selected from a group consisting of:
a known single stream communications standard; and
a proprietary communications protocol.

22. The method of claim 21, wherein step (B)(i) comprises:
(B)(i)(1) processing the first plurality of communications signals using at least one selected from a group consisting of:
an Institute of Electrical and Electronics Engineers (IEEE) 802.11a™ standard;
an IEEE 802.11b™ standard;
an IEEE 802.11j™ standard; and
an IEEE 802.11g™ standard.

* * * * *

UNITED STATES PATENT AND TRADEMARK OFFICE
CERTIFICATE OF CORRECTION

PATENT NO.        : 8,199,857 B2                                       Page 1 of 1
APPLICATION NO.   : 12/213175
DATED             : June 12, 2012
INVENTOR(S)       : Gaikwad et al.

It is certified that error appears in the above-identified patent and that said Letters Patent is hereby corrected as shown below:

At column 24, line 48, please replace "produces" with --produce--.

At column 25, line 45, please replace "being," with --being--.

At column 26, line 17, please replace "single; stream communications" with --single stream communications standard--.

At column 26, line 32, please replace "using," with --using--.

Signed and Sealed this
Twenty-eighth Day of August, 2012

David J. Kappos
*Director of the United States Patent and Trademark Office*